(12) United States Patent
Moll et al.

(10) Patent No.: US 7,647,452 B1
(45) Date of Patent: Jan. 12, 2010

(54) RE-FETCHING CACHE MEMORY ENABLING LOW-POWER MODES

(75) Inventors: Laurent R. Moll, San Jose, CA (US); Peter N. Glaskowsky, Cupertino, CA (US); Joseph B. Rowlands, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 422 days.

(21) Appl. No.: 11/751,949

(22) Filed: May 22, 2007

Related U.S. Application Data

(63) Continuation-in-part of application No. 11/740,892, filed on Apr. 26, 2007, now Pat. No. 7,443,759, and a continuation-in-part of application No. 11/740,901, filed on Apr. 26, 2007, and a continuation-in-part of application No. 11/351,070, filed on Feb. 9, 2006, now Pat. No. 7,516,274, and a continuation-in-part of application No. 11/351,058, filed on Feb. 9, 2006, now Pat. No. 7,412,570.

(60) Provisional application No. 60/736,632, filed on Nov. 15, 2005, provisional application No. 60/736,736, filed on Nov. 15, 2005, provisional application No. 60/761,220, filed on Jan. 23, 2006, provisional application No. 60/761,925, filed on Jan. 25, 2006, provisional application No. 60/746,049, filed on Apr. 30, 2006, provisional application No. 60/747,200, filed on May 14, 2006, provisional application No. 60/747,818, filed on May 22, 2006, provisional application No. 60/803,367, filed on May 28, 2006.

(51) Int. Cl.
*G06F 12/00* (2006.01)
(52) U.S. Cl. ..................................... 711/118
(58) Field of Classification Search ................. None
See application file for complete search history.

(56) References Cited

U.S. PATENT DOCUMENTS 3,938,097 A    2/1976   Niguette, III (Continued)

FOREIGN PATENT DOCUMENTS

JP    06195265    7/1994

OTHER PUBLICATIONS

Handy, J., The Cache Memory Book, Second Edition, Academic Press, Inc., 1998, pp. 2-5 and 80-87.

(Continued)

*Primary Examiner*—Kevin Verbrugge
(74) *Attorney, Agent, or Firm*—Osha • Liang LLP

(57) ABSTRACT

A re-fetching cache memory improves efficiency of a processor, for example by reducing power consumption and/or increasing performance. When the cache memory is disabled or temporarily used for another purpose, a data portion of the cache memory is flushed, and a tag portion is saved in an archive. In some embodiments, the tag portion operates "in-place" as the archive, and in further embodiments, is placed in a reduced-power mode. In some embodiments, less than the full tag portion is archived. When the cache memory is re-enabled or when the temporary use completes, optionally and/or selectively, the tag portion is repopulated from the archive, and the data portion is re-fetched according to the repopulated tag portion. In some embodiments, less than the full archive is restored. According to various embodiments, processor access to the cache is enabled during one or more of: the saving; the repopulating; and the re-fetching.

49 Claims, 6 Drawing Sheets

U.S. PATENT DOCUMENTS

| | | | |
|---|---|---|---|
| 5,493,668 | A | 2/1996 | Elko et al. |
| 5,559,952 | A | 9/1996 | Fujimoto |
| 6,317,744 | B1 | 11/2001 | Elko et al. |
| 7,266,641 | B2 | 9/2007 | Kamei et al. |
| 7,523,284 | B1 | 4/2009 | Wilson |
| 2003/0033386 | A1 | 2/2003 | Dahlen et al. |
| 2005/0005073 | A1 | 1/2005 | Pruvost et al. |
| 2005/0044448 | A1 | 2/2005 | Verdun |
| 2006/0143396 | A1 | 6/2006 | Cabot |
| 2006/0218352 | A1 | 9/2006 | Shannon et al. |
| 2006/0268592 | A1 | 11/2006 | Mohammad et al. |
| 2007/0011421 | A1 | 1/2007 | Keller et al. |
| 2007/0094450 | A1 | 4/2007 | VanderWiel |
| 2007/0233964 | A1 | 10/2007 | Robinson |
| 2008/0294846 | A1 | 11/2008 | Bali et al. |

OTHER PUBLICATIONS

Mostinski, R. and Yoder, D., 2D/3D Graphics Support in the i.MX31 and i.MX31L Multimedia Applications Processors, Freescale Semiconductor, Jun. 2005, pp. 1-12.

Pan, H. and Asanovic, K., Heads and Tails: A Variable-Length Instruction Format Supporting Parallel Fetch and Decode, CASES '01, Nov. 16-17, 2001, pp. 1-8.

Hennessy, J. L. and Patterson, D. A., Computer Organization and Design, The Hardware/Software Interface, Second Edition, 1998, pp. 19 and B-31.

Speight, E., Shafi, H., Zhang, L., Rajamony, R., "Adaptive Mechanisms and Policies for Managing Cache Hierarchies in Chip Multiprocessors", Novel Systems Architecture Group, ISCA'05, May 2005, 11 pages.

Hanlon, A., "Content-Addressable and Associative Memory Systems", IEEE, May 2, 1966, 13 pages.

Sartor, J., Venkiteswaran, S., McKinley, K., Wang, Z., "Cooperative Caching with Keep-Me and Evict-Me", The Computer Society, Jan. 2005, 12 pages.

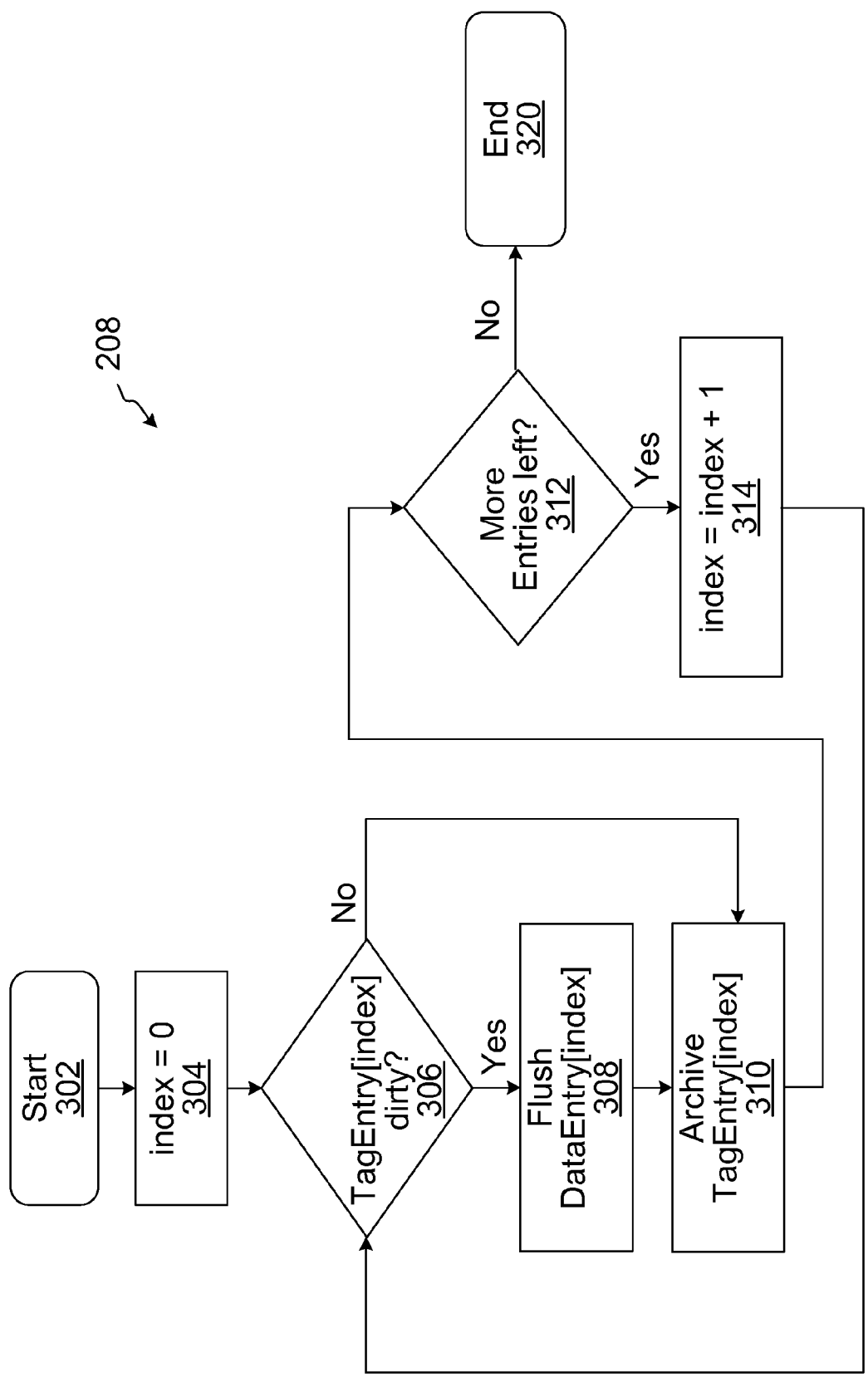

RE-FETCHING CACHE MEMORY ENABLING LOW-POWER MODES

CROSS REFERENCE TO RELATED APPLICATIONS

Priority benefit claims for this application are made in the accompanying Application Data Sheet (if any). To the extent permitted by the type of the instant application, this application incorporates by reference for all purposes the following application(s), which are all owned by the owner of the instant application:
- U.S. Provisional Application Ser. No. 60/736,632, filed Nov. 15, 2005, first named inventor Laurent R. Moll, and entitled POWER CONSERVATION VIA DRAM ACCESS REDUCTION;
- U.S. Provisional Application Ser. No. 60/736,736, filed Nov. 15, 2005, first named inventor Laurent R. Moll, and entitled A SMALL AND POWEREFFICIENT CACHE THAT CAN PROVIDE DATA FOR BACKGROUND DMA DEVICES WHILE THE PROCESSOR IS IN A LOW-POWER STATE;
- U.S. Provisional Application Ser. No. 60/761,220, filed Jan. 23, 2006, first named inventor Laurent R. Moll, and entitled POWER CONSERVATION VIA DRAM ACCESS REDUCTION;
- U.S. Provisional Application Ser. No. 60/761,925, filed Jan. 25, 2006, first named inventor Laurent R. Moll, and entitled A SMALL AND POWEREFFICIENT CACHE THAT CAN PROVIDE DATA FOR BACKGROUND DMA DEVICES WHILE THE PROCESSOR IS IN A LOW-POWER STATE;
- U.S. Non-Provisional application Ser. No. 11/351,070, filed Feb. 9, 2006, first named inventor Laurent R. Moll, and entitled POWER CONSERVATION VIA DRAM ACCESS REDUCTION;
- U.S. Non-Provisional application Ser. No. 11/351,058, filed Feb. 9, 2006, first named inventor Laurent R. Moll, and entitled A SMALL AND POWEREFFICIENT CACHE THAT CAN PROVIDE DATA FOR BACKGROUND DMA DEVICES WHILE THE PROCESSOR IS IN A LOW-POWER STATE;
- U.S. Provisional Application Ser. No. 60/746,049, filed Apr. 30, 2006, first named inventor Joseph B. Rowlands, and entitled REDUCED POWER CACHE MEMORY WITH PER-SECTOR POWER CONTROL;
- U.S. Provisional Application Ser. No. 60/747,200, filed May 14, 2006, first named inventor Joseph B. Rowlands, and entitled REDUCED POWER CACHE MEMORY WITH PER-SECTOR POWER CONTROL;
- U.S. Provisional Application Ser. No. 60/747,818, filed May 22, 2006, first named inventor Laurent R. Moll, and entitled RE-FETCHING CACHE MEMORY;
- U.S. Provisional Application Ser. No. 60/803,367, filed May 28, 2006, first named inventor Laurent R. Moll, and entitled RE-FETCHING CACHE MEMORY;
- U.S. Non-Provisional application Ser. No. 11/740,892, filed, Apr. 26, 2007, first named inventor Joseph Rowlands, and entitled REDUCED-POWER MEMORY WITH PER-SECTOR GROUND CONTROL; and
- U.S. Non-Provisional application Ser. No. 11/740,901, filed, Apr. 26, 2007, first named inventor Joseph Rowlands, and entitled REDUCED-POWER MEMORY WITH PER-SECTOR POWER/GROUND CONTROL AND EARLY ADDRESS.

This application is related to the following application(s) filed simultaneously herewith and which are all owned by the owner of the instant application, and to the extent permitted by the type of the instant application, this application incorporates by reference for all purposes the following application(s):
- U.S. Non-Provisional Application Ser. No. 11/751,973 entitled RE-FETCHING CACHE MEMORY ENABLING ALTERNATIVE OPERATIONAL MODES; and
- U.S. Non-Provisional Application Ser. No. 11/751,985 entitled RE-FETCHING CACHE MEMORY HAVING COHERENT RE-FETCHING.

BACKGROUND

Some processors, such as microprocessors, use one or more levels of cache memory in a memory hierarchy to reduce access time to data, and thus to improve performance. Some processors have sleep and/or low-power modes wherein much of the logic of the processor is powered-off and does not retain state, saving overall system power when the processor is not in use. Power savings of a sleep mode, however, is mitigated due to issues with one or more levels of cache associated with the processor. Keeping the caches powered on during sleep mode allows them to retain state, but consumes significant amounts of power, leading to increased cooling costs, reduced battery life, and reduced reliability. Powering off the caches in sleep mode consumes power in a different manner, due to reloading state into the caches from demand misses in empty (after being powered off) caches. In some processors, demand misses consume power and/or reduce performance by causing the processor to be powered on, but to be idle until the demand miss is satisfied.

Some processors and/or processor systems provide one or more caches and one or more buffers, leading, in some usage scenarios, to one or more of increased die size, increased power consumption, or complexity. Examples of the buffers include Input/Output (I/O) buffers (such as for use with a direct memory access controller) and graphics buffers.

SUMMARY OF THE INVENTION

The invention, in response to significant power consumed by caches, provides a re-fetching cache memory enabling low-power modes. In some embodiments, a method comprises requesting, archiving, reducing, and repopulating. The requesting is for at least a portion of a cache to enter a low-power mode, the cache comprising a plurality of data entries and a plurality of tag entries. The tag entries are in a one-to-one correspondence with the data entries, each of the data entries is enabled to store a line of data, and each of the tag entries is enabled to store a tag usable, at least in part, to identify any line of data stored in the corresponding data entry. The archiving archives in a tag archive area, in response to the requesting, particular tags stored in at least some of the tag entries. The reducing, in response to the requesting, reduces power provided to at least some of the data entries. The repopulating, after the act of reducing power, repopulates a subset of the tag entries from the tag archive area. In some embodiments, the cache and the processor are implemented within one or more integrated circuits.

In some embodiments, a computer processing system comprises a cache circuit and control logic. The cache circuit comprises a plurality of data entries and a plurality of tag entries. The tag entries are in a one-to-one correspondence with the data entries, each of the data entries is enabled to store a line of data, and each of the tag entries is enabled to store a tag usable, at least in part, to identify any line of data in the corresponding data entry. The control logic is enabled to direct archiving in a tag archive area, in response to receiving a request to enter a low-power mode, particular tags stored in at least some of the tag entries, is additionally enabled, in response to the receiving the request, to direct reducing power provided to at least some of the data entries, and is enabled to direct repopulating a subset of the tag entries from the tag archive area. In various embodiments, the repopulating is subsequent to the reducing power. In some embodiments, the cache circuit and the control logic are implemented within one or more integrated circuits.

In some embodiments, a medium readable by a computer system contains descriptions that specify, when interpreted by the computer system, a representation of a circuit comprising a cache of a processor and control logic. The cache comprises a plurality of data entries and a plurality of tag entries. The tag entries are in a one-to-one correspondence with the data entries, each of the data entries is enabled to store a line of data, and each of the tag entries is enabled to store a tag usable, at least in part, to identify any line of data in the corresponding data entry. The control logic is enabled to operate with the cache. The control logic is additionally enabled in response to receiving a request to enter a low-power mode, to direct archiving in a tag archive area particular tags stored in at least some of the tag entries, is additionally enabled in response to the receiving the request, to direct reducing power provided to at least some of the data entries, and is enabled to direct repopulating at least a subset of the tag entries from the tag archive area. In various embodiments, the repopulating is subsequent to the reducing power.

In some embodiments, a system comprises means for caching, means for archiving, means for reducing power, and means for repopulating. The means for caching comprises a plurality of data entries and a plurality of tag entries. The tag entries are in a one-to-one correspondence with the data entries, each of the data entries is enabled to store a line of data, and each of the tag entries is enabled to store a tag usable, at least in part, to identify any line of data in the corresponding data entry. The means for archiving operates to archive particular tags stored in at least some of the tag entries, and is responsive to receiving a request to enter a low-power mode. The means for reducing power operates to reduce power provided to at least some of the data entries, and is additionally responsive to the receiving the request. The means for repopulating operates to repopulate at least a subset of the tag entries in accordance with the means for archiving, and operates subsequent to the means for reducing power.

The invention is optionally embodied in various embodiments, including but not limited to one or more of a process, an article of manufacture, an apparatus, a system, a composition of matter, and a computer readable medium such as a computer readable storage medium or a computer network wherein program instructions, interpretable parameters, and hardware descriptions are sent over optical or electronic communication links.

DESCRIPTION OF THE FIGURES

FIG. 3A illustrates selected details of a process used in an embodiment of a re-fetching cache memory to flush the cache and to archive the cache tags.

DETAILED DESCRIPTION OF EMBODIMENTS OF THE INVENTION

Figure 1A:
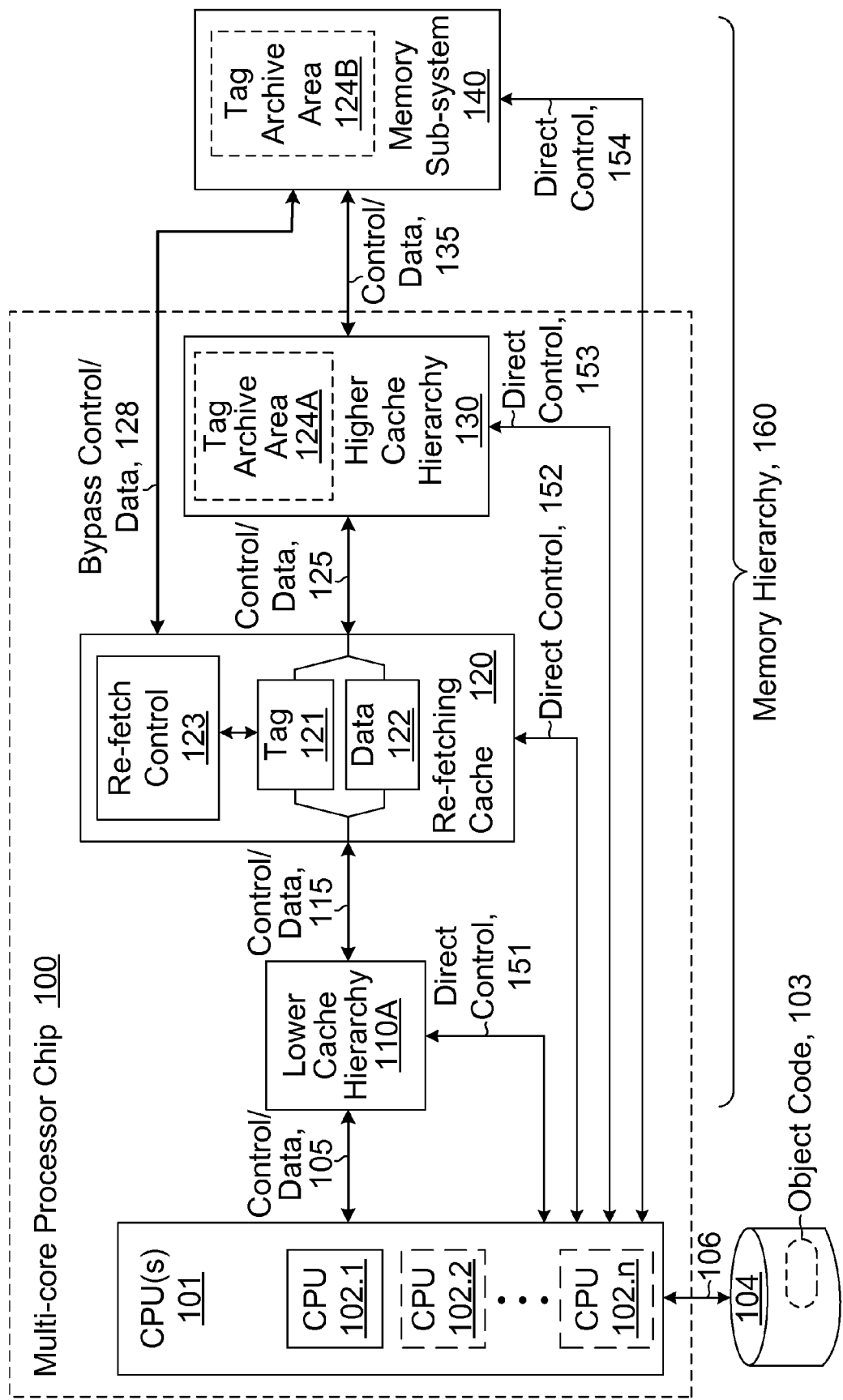
FIG. 1A illustrates an embodiment of a processor system incorporating a re-fetching cache memory as part of a memory hierarchy.

A detailed description of one or more embodiments of the invention is provided below along with accompanying figures illustrating selected details of the invention. The invention is described in connection with the embodiments. It is well established that it is neither necessary, practical, or possible to exhaustively describe every embodiment of the invention. Thus the embodiments herein are understood to be merely exemplary, the invention is expressly not limited to or by any or all of the embodiments herein, and the invention encompasses numerous alternatives, modifications and equivalents. To avoid monotony in the exposition, a variety of word labels (including but not limited to: first, last, certain, various, further, other, particular, select, some, and notable) may be applied to separate sets of embodiments; as used herein such labels are expressly not meant to convey quality, or any form of preference or prejudice, but merely to conveniently distinguish among the separate sets. The order of some operations of disclosed processes is alterable within the scope of the invention. Wherever multiple embodiments serve to describe variations in process, method, and/or program instruction features, other embodiments are contemplated that, in accordance with a predetermined or a dynamically determined criterion, perform static and/or dynamic selection of one of a plurality of modes of operation corresponding respectively to a plurality of the multiple embodiments. Numerous specific details are set forth in the following description to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. As is described in more detail in the Conclusion section, the invention encompasses all possible modifications and variations within the scope of the issued claims.

Introduction

This introduction is included only to facilitate the more rapid understanding of the Detailed Description. The invention is not limited to the concepts described in the introduction, as the paragraphs of any introduction are necessarily an abridged view of the entire subject and are not meant to be an exhaustive or restrictive description. For example, the introduction that follows provides overview information limited by space and organization to only some embodiments. There are in fact many other embodiments, including those to which claims will ultimately be drawn, that are described throughout the balance of the specification.

Terms

Elsewhere herein various terms are used with respect to descriptions of embodiments. Examples of some of the terms follow.

An example of a cache line (also called a line) is an aligned "unit" of memory, such as a power-of-two number of bytes aligned on a boundary the size of the number of bytes. A data portion of a cache comprises multiple data entries, each data entry enabled to store contents of a cache line of memory as a line of data.

In some embodiments, the terms cache tag or tag are interchangeable and refer to non-data state associated with a line of data in a cache. A tag portion of a cache comprises multiple tag entries, each tag entry enabled to store a cache tag. The tag entries and the data entries are in a one-to-one correspondence; each one of the tag entries corresponds to a respective one of the data entries, and the respective data entry in turn corresponds to the each tag entry. Each of the tag entries identifies, at least in part, contents of the respective data entry. In various embodiments, a cache tag contained in a particular tag entry comprises a portion of an address of an associated line of data contained in the corresponding data entry. (For clarity, the description herein refers to a cache tag having an associated line of data, and a tag entry having a corresponding data entry. In some embodiments, a cache tag comprises a portion of an address, and the address identifies, at least in part, a line of data, thus forming an association between the cache tag and the line of data via the address.) According to various embodiments, the portion of the address is physical, virtual, or some combination thereof. In some embodiments, a combination of the portion of the address and an index of the particular tag entry provide sufficient information to uniquely identify the associated line of data. In other embodiments, such as some where the portion of the address is virtual, there is additional information, such as a translation look-aside table (outside of the cache), used to uniquely identify the associated line of data. In various embodiments, the cache tag comprises a valid indication that signifies if the associated line of data is present.

In some embodiments, the cache tag comprises a clean/dirty indication that signifies whether the associated line of data has been modified in the cache and is thus different from a copy stored elsewhere, such as in a higher-level cache of the cache hierarchy, or in the memory system. In some embodiments, the cache tag comprises cache coherency state, such as a MESI (Modified, Exclusive, Shared, or Invalid) state encoding. In various embodiments, the cache coherency state encodes the valid indication and/or the clean/dirty indication. For example, the MESI encoding of the valid indication is any state except the invalid state; the MESI encoding of the dirty indication is the modified state. In some embodiments, the cache tag comprises a likely-to-be-used-soon indicator. In further embodiments, a tag entry comprises a likely-to-be-used-soon bit for storage of the likely-to-be-used-soon indicator.

In some embodiments, a set-associative, multi-way cache comprises a plurality of independent ways (portions), wherein data at a given address is enabled to reside in any one of the ways. In various embodiments, each way has a tag portion and a data portion. In some embodiments, to look up an address to determine if any data associated with the address is resident in the cache, a first portion of the address is used as an index for all of the data portions in parallel. In further embodiments a second portion of the address is used as an index for all of the tag portions. In still further embodiments, a third portion of the address is compared with cache tags read in parallel from the tag portions, and the results of the comparisons are used, at least in part, to select among data read in parallel from one or more of the data portions.

In some embodiments using a set-associative, multi-way cache, the tag entries are further enabled to store least-recently used (LRU), or equivalently most-recently-used (MRU), information for each set of tag entries. In some embodiments, the LRU (or MRU) information is a function of a set of tag entries, one tag entry from each way of the cache, and is thus per-set information that is not easily divided into per-cache-tag information. In other embodiments, the LRU (or MRU) information is per-tag-entry. For ease of explanation, however, the LRU and MRU information is described as if it were always per-tag-entry. Various embodiments that store the LRU (or MRU) information as per-set information access the per-set LRU (or MRU) information whenever accessing one of the tag entries in the corresponding set. In some embodiments, a cache tag is associated with other information about the line of data including one or more of: reference counters; last-access time timestamps; creation-time timestamps; and a likely-to-be-used-soon indicator. For ease of explanation, the other information is also considered to be part of the cache tags, and the tag entries are enabled to store the other information.

Heretofore, the term line has been used to refer to a tagged portion of data in a cache. The use of this term does not preclude other embodiments of caches in which the data is in a format other than a line of memory, such as a block of memory, where, for example, a block includes multiple lines. The use of the term line is not intended to be limiting, and a line should be understood to refer to a tagged data item in a cache, irrespective of the size or composition or location of that data item.

An example of archiving is saving cache tags stored in tag entries of a cache in an archive area from which at least some of the tag entries of the cache are later repopulated. Archiving is implemented according to various manners and formats compatible with later repopulation of some or all of the tag entries. In various embodiments, all or any portion of the cache tags are archived by copying into an archive area that is distinct from the tag entries. In various embodiments, all or any portion of the cache tags are archived by preventing modification (for example by disabling writes, such as by gating off a write enable signal controlling at least a portion of the tag entries) to the archived portion, resulting in an "in-place" archive. The archived portion is then placed into a reduced-power mode where contents of at least some of the tag entries are retained and where cache tags (stored in the at least some of the tag entries) are inaccessible for processor and snoop accesses. According to various embodiments, the archive area is in one or more of: the tag entries themselves; one or more higher-level caches in a memory hierarchy; a main memory system; a special-purpose and/or dedicated memory; a set of registers, latches, and/or flip-flops; and any combination thereof. In some embodiments, the minimum information saved in the archive area for each cache tag saved is address information sufficient to restore an address portion of the cache tag and re-fetch an associated line of data, as well as a valid indication for the cache tag. In some embodiments, the presence of a cache tag in the archive area is sufficient to indicate validity.

In some embodiments using a set-associative, multi-way cache, the archive of the cache tags omits storage of one or more less recently used ways. In some embodiments using a set-associative, multi-way cache, the way information for an individual cache tag is saved, while in other embodiments the way information is implied by location in the archive area. In some embodiments, the archive for an individual cache tag comprises full cache coherency state, while in other embodiments abbreviated cache coherency state is saved (such as by omitting information regarding clean and dirty states). In some embodiments, the archiving of each cache tag saves the state of the cache tag as it was prior to a flush of the associated line of data. In some embodiments using a set-associative, multi-way cache, the archive of the cache tags comprises least-recently used (LRU), or equivalently most-recently-used (MRU), information.

An example of repopulation of tag entries is restoring cache tags saved in an archive area into the tag entries, the cache tags comprising address and corresponding validity information. According to various embodiments, repopulation is by one or more of: copying from an archive area that is distinct from the tag entries; and allowing modification (for example by enabling writes) to an in-place archived portion of the tag entries. If the archived portion was previously placed into a reduced-power mode, then the portion is placed into an operational (or accessible) mode. In some embodiments, repopulation ensures that each repopulated tag entry is restored with the previous address and validity information (i.e., with a same cache tag as the tag entry previously held). In some embodiments, such as those including virtual address bits in the cache tags or as all or part of the cache index, restoring a cache tag into a tag entry optionally updates a translation look-aside buffer. In some embodiments, such as those including virtual and physical address bits in the cache tags or as all or part of the cache index, restoring a cache tag produces different physical address bits if one or more translation look-aside buffer entries have changed. In some embodiments, other state information (such as a clean/dirty indication or cache coherency state) is restored as well. In some embodiments that restore cache coherency state, a cache coherency operation is executed to ensure that the restored cache coherency state is consistent with other caches.

In some embodiments, tag entries that held cache tags that were saved in the archive area are repopulated, and other tag entries are not repopulated. In some embodiments, the other tag entries are forced to be invalid. In various embodiments, not all cache tags in the archive area are restored into tag entries. In various embodiments, tag entries that held cache tags that were saved in the archive area, but not repopulated, are forced to be invalid. In some embodiments, a cache tag is not restored from the archive area if the associated line of data is already in the cache. In some embodiments using a set-associative, multi-way cache, a cache tag is archived and then restored into a same way of the cache, while in other embodiments the cache tag is archived from a first way and then restored into a second way. In some embodiments using a set-associative, multi-way cache, a cache tag is not restored from the archive if all the ways of the cache the cache tag is restorable into are already in use. In some embodiments, the tag entries are repopulated in a different order than when the archive was created. In some embodiments, the cache tags are restored in an order that restores most important cache tags first. In various embodiments, cache tags are considered more important due to factors including: MRU information; reference counters; access timestamps; creation timestamps; and a likely-to-be-used-soon indicator.

An example of re-fetching of data entries is reloading one or more lines of data into respective data entries of a cache in accordance with a repopulated version of corresponding tag entries. The order of data entry re-fetch is independent of the order of tag entry repopulation. In some embodiments that implement restoration of any portion of the state of a cache tag other than address and validity (such as a clean/dirty indication, or such as cache coherency state) into a particular tag entry, the re-fetching into the corresponding data entry of the associated line of data is in accordance with system-level state of the associated line of data (e.g., the re-fetching is cache coherent). In some embodiments, the re-fetching is performed in conjunction with executing a cache coherency operation for the associated line of data. In various embodiments, the cache coherency operation is executed among peer cache memories. In various embodiments, the cache coherency operation is executed among caches at different levels of a memory hierarchy.

An example of a flush is a process that ensures contents of data entries of a cache are consistent within a system containing the cache. In some embodiments, a flush alters contents of tag entries. For example, a flush of a cache ensures that there are no modified lines of data (stored in "dirty" data entries) in the cache by sending the contents of each dirty data entry to a higher-level portion of a memory hierarchy of the system, and by changing the state of the cache tag stored in the corresponding tag entry from dirty to clean. (A "dirty" data entry has a corresponding cache tag marked as "dirty," that is, modified in the cache.) In some embodiments, a flush leaves a dirty data entry invalid, rather than valid and clean. In some embodiments where cache coherency state (such as MESI state) is maintained in the cache tags, a flush changes an exclusive state to a shared state. In some embodiments, a change in the state of a cache tag from exclusive to shared during a flush is communicated to other caches in the memory hierarchy. In various embodiments, a flush of a data entry is selectively performed, as determined, at least in part, based on a cache state of a cache tag stored in a corresponding tag entry. For example, in some embodiments, a data entry is flushed solely if the cache state indicates that the line of data stored in the data entry is dirty.

In some embodiments, a cache is said to be associated with a processor, or a processor is said to be associated with a cache, when memory (or I/O) accesses from the processor to the memory hierarchy (or I/O system) go through or search the cache. The memory (or I/O) accesses, such as processor reads and writes, are understood to be distinct from diagnostic or control accesses that, in some embodiments, use different data paths, sometimes at lower rates. In some embodiments where there exists a hierarchy of caches, a processor is associated with multiple caches, such as one at each level of the cache hierarchy. In some embodiments where caches contain distinct types of data, such as instruction caches and data caches, a processor is associated with multiple caches at one level of the cache hierarchy. In some embodiments that have a plurality of processors, multiple processors are associated with one cache.

In some usage scenarios, cache memories are used in processor systems to reduce latency associated with access to larger memories, such as DRAM, that are sometimes both slower to access and further from the processor. In some embodiments of processor systems, there are multiple cache memories, arranged as a memory hierarchy, with lower-level caches being closer to the processors, and higher-level caches being closer to a main memory (such as DRAM). In various embodiments, multi-processor systems have multiple cache memories at one level of such a memory hierarchy, each cache memory associated with one or more processors. In some embodiments, the data contents of lower-level caches of the cache hierarchy are always included in higher-level portions of the memory hierarchy; in other embodiments, lower-level caches of the cache hierarchy optionally store data that is not in other levels of the cache hierarchy, and is only otherwise represented in main memory.

Overview

Overall power savings of a system is, in some usage scenarios, advantageously improved by a re-fetching cache memory enabling low-power modes. An ability to use a cache for multiple purposes is advantageously improved, in some embodiments, by a re-fetching cache memory enabling alternative operational modes. Performance and/or power of systems, such as processor systems, comprising caches are advantageously improved in various embodiments by re-fetching cache memories having coherent re-fetching.

A re-fetching cache memory improves efficiency of a system and/or of a processor, for example by advantageously sharing the cache memory and/or by reducing power consumption and/or by increasing performance. When some or all of the cache memory is disabled or temporarily used for another purpose, some or all of a data portion of the cache memory is flushed, and some or all of a tag portion is saved in an archive. In some embodiments, some or all of the tag portion operates "in-place" as the archive, and in further embodiments, is placed in a reduced-power mode. In various embodiments, less than the full tag portion is archived. When the cache memory is re-enabled or when the temporary use completes, optionally and/or selectively, at least some of the tag portion is repopulated from the archive, and the data portion is re-fetched according to the repopulated tag portion. In some embodiments, less than the full archive is repopulated. According to various embodiments, processor access to the cache is enabled during one or more of: the saving; the repopulating; and the re-fetching.

In some embodiments, when the cache memory is disabled or temporarily used for another purpose, some or all of a tag portion is saved in an archive. When the cache memory is re-enabled or when the temporary use completes, optionally and/or selectively, the tag portion is repopulated from some or all of the archive. In various embodiments, the re-fetching is performed in a cache coherent fashion.

In some low-power systems, processors are put into low-power modes, such as a sleep mode, to save power. For example, in one embodiment of a sleep mode, a processor is inactive, and execution is suspended until some external agent, such as an interrupt or a timer, wakes the processor up to resume operation. In some embodiments and/or usage scenarios, a processor is requested to enter (directed into) sleep mode (such as by control software and/or by a control processor), and in response caches associated with the processor are requested (directed) into a lower-power mode. In some embodiments, a cache is directed into a lower-power mode by reducing power to the cache, such as by reducing voltage and/or by decreasing a voltage differential. Putting a data portion of a cache into a low-power mode causes the cache to lose state, due to explicit state draining (such as flushing) or due to electrical effects (such as nodes discharging when the cache power supply is reduced). Caches are flushed prior to entry into a low-power mode so that any modified or private data is made consistent with the remainder of the system before the data is lost. In some usage scenarios, the loss of data in a cache associated with a processor sometimes leads to performance loss when the processor is re-awakened, i.e. some portion of state the processor had built up in the associated cache is gone, and is replenished from higher-level portions of the memory hierarchy.

In some low-power systems, a cache is advantageously re-used for other purposes, for example to reduce one or more of die area, power consumption, or complexity. For example, a system with a third-level cache comprising a large RAM for the data portion of the cache sometimes uses all or a portion of the large RAM as an I/O buffer, or alternatively as a graphics buffer. Prior to an alternative usage, the cache, or at least a portion to be re-used, is flushed. In some usage scenarios, one or more ways of a set-associative, multi-way cache are temporarily used for an alternative purpose, such as for a graphics buffer, while other ways remain in use by one or more processors. When the alternative usage is complete, the previous cache state is restored to reduce demand misses and potential less efficient use of the processor.

In some usage scenarios, the alternative usage as described above is a usage by another processor that has an associated archive for the re-fetching cache memory. For example, two or more processors share one cache in a Time Division Multiplexing (TDM) fashion. Each processor in turn wakes up, repopulates the tag entries and re-fetches the corresponding data entries using a respective archive, executes until some predetermined time or condition, creates a new version of the respective archive, and then goes into a sleep mode. The archiving and repopulating/re-fetching enable each processor to create a separate "personality" for the cache while the respective processor is executing. In some embodiments, the cache is never powered-down; in other embodiments, the cache is powered-down when none of the processors that are sharing the cache are active.

In some usage scenarios a re-fetching cache memory advantageously reduces overall power consumption of a processor chip, reduces effective memory system latency, or both. According to various embodiments, a re-fetching cache memory is included in any one or more of each of the levels of caches in a memory hierarchy, such as a first-level (or innermost) cache and/or a second-level cache and/or a highest-level (or outermost) cache. In some embodiments, when a processor enters a sleep mode, a cache associated with the processor enters a low-power or disabled mode and data in the cache is not retained. To prevent data loss, the pre-disable contents of the associated cache are flushed before the associated cache enters the low-power mode. Using a re-fetching cache memory for the associated cache provides a way to restore some or all of the pre-disable contents of the cache when the associated cache is re-enabled. Re-loading the pre-disable contents reduces or prevents demand misses when the processor exits sleep mode and requests data that was previously in the associated cache. In some usage scenarios, overall processor efficiency is increased (via any combination of power and latency reduction) by re-loading the pre-disable contents in advance of the processor accesses, since the processor does not have to wait for the data to be fetched from a higher-level portion of the memory hierarchy.

Archiving and Repopulating

In some embodiments, cache tags stored in at least some of a plurality of tag entries of a re-fetching cache memory are archived in a tag archive area before the cache is disabled. When the cache is re-enabled, cache tag information, including some or all of any combination of address, validity, clean/dirty indication, and coherency state, from the tag archive area is restored into at least some of the tag entries. Each restored cache tag (or, in some embodiments, each repopulated tag entry) is used to re-load an associated line of data into a corresponding data entry. In some embodiments, the cache is enabled for processor and snoop accesses after the repopulation of the tag entries and the re-fetching of the corresponding pre-disable data entries completes. In other embodiments, the cache is enabled for processor and snoop accesses while any combination of the repopulation of the tag entries and the re-fetching of the corresponding pre-disable data entries are in progress. In some usage scenarios, a pre-disable line of data that was stored in the cache is optionally modified by processors or other components in the system during the time the cache was disabled; the reloaded line of data includes any such modifications.

In some embodiments, a re-fetching cache memory enables multiple operational modes for a cache. For example, consider a cache that is used as a conventional cache some of the time and is used as a graphics buffer at other times. Cache tags (stored in at least some of the tag entries) are archived to a tag archive area and the cache is flushed before the cache is used as a graphics buffer. When the graphics buffer usage completes, at least some of the tag entries are repopulated from the tag archive area, and corresponding data entries are re-fetched. Conventional cache operation then resumes. In various embodiments, a portion less than all of the cache memory is used for another purpose, and that portion is archived and repopulated/re-fetched.

In some embodiments, a set-associative, multi-way cache employs a large number of ways to support a plurality of associated processors. As one or more of the processors enter a sleep mode, a need for the large number of ways is lessened, and some of the ways are put into a low-power disabled mode. As the processors exit the sleep mode, some of the disabled ways are re-enabled. In some embodiments, the number of active ways is proportional to the number of active associated processors. By using a re-fetching cache memory, the state that was present in the disabled ways is restorable when the disabled ways are re-enabled.

In some usage scenarios, a re-fetching cache memory enables reloading a cache with previous data (lost due to disabling or displaced by replacement or other uses) to reduce demand misses resulting from processor accesses to the previous data. For example, in an embodiment using a re-fetching cache memory for a cache, when the processor enters a sleep mode, the cache is flushed, and then disabled. Before, during, or after the flushing of the cache, an archive of cache tags (read from at least some of a plurality of tag entries of the cache) is created. When the processor is re-awakened, the archive is used to repopulate some or all of the tag entries and to re-fetch corresponding data entries, thus restoring previous cache state and reducing demand misses.

In some usage scenarios, cache tags (read from tag entries) of a first cache memory associated with a first processor are archived in an archive in a tag archive area before the first cache is disabled. According to various embodiments, the first cache either is or is not a re-fetching cache memory. Subsequently, at least a portion of the archive is restored into tag entries of a second (re-fetching) cache memory, and the repopulated tag entries are used to re-fetch corresponding data entries into the second cache. According to various embodiments, the first cache is either smaller than, the same size as, or larger than the second cache. According to various embodiments, the first cache has fewer ways, a same number of ways, or more ways than the second cache. In some embodiments, least-recently used information stored as part of the archive enables restoring a more-recently-used subset of cache tags. According to various embodiments, the second cache is at a different level of a cache hierarchy than the first cache; and the second cache is associated with a second processor different from the first processor. For example, cache tags of a cache associated with a first processor of a plurality of processors in a multi-processor are archived in an archive when the first processor is disabled, such as by being placed into a sleep mode. Subsequently, the archive is restored into tag entries of a re-fetching cache memory associated with a second one of the processors, thus enabling, in some usage scenarios, improved performance of migration of workload among the processors.

In some embodiments, a re-fetching cache memory comprises a dedicated tag read path to read tag entries of the cache and create an archive. In other embodiments, a tag read path is shared by other uses, including one or more of: a diagnostic read path; and a processor and/or snoop access path.

In some embodiments, a re-fetching cache memory comprises a dedicated tag write path to write tag entries of the cache to repopulate the tag entries. In other embodiments, a tag write path is shared by other uses, including one or more of: a diagnostic write path; and a processor and/or snoop fill path.

In some embodiments, a re-fetching cache memory comprises a dedicated data write path to write data entries of the cache when the data entries are re-fetched. In other embodiments, a data write path is shared by other uses, including one or more of: a diagnostic write path; and a processor and/or snoop fill path.

In some embodiments, each cache tag of a re-fetching cache memory comprises and/or is associated with a "likely-to-be-used-soon" indicator. According to various embodiments, the likely-to-be-used-soon indicator is set and/or maintained by one or more of: hardware; firmware; software; and any combination thereof. In some embodiments and/or usage scenarios, the likely-to-be-used-soon indicator indicates cache tags (and thus the associated lines of data) that are more likely to be accessed by a processor shortly after repopulation and re-fetching of the re-fetching cache memory. According to various embodiments, the likely-to-be-used soon indicator is set for one or more of: a cache tag stored in a tag entry having a corresponding data entry that was recently loaded into the re-fetching cache memory; a cache tag having an associated line of data that is higher priority for reloading into the re-fetching cache memory; and a cache tag stored in a tag entry having a corresponding data entry that is loaded into the re-fetching cache memory (due to a miss by the processor) within a (programmatic or predetermined) time interval after the re-fetching cache memory (or a portion of the re-fetching cache memory) is re-enabled. In some embodiments, shortly after the re-fetching cache memory is repopulated and re-enabled for use by the processor, software and/or firmware places the re-fetching cache memory into a mode where cache tags associated with lines of data that missed in the cache are stored in tag entries with the likely-to-be-used-soon indicator set. After a period of time, the mode is disabled, and particular ones of the cache tags stored in tag entries of the cache are left with the likely-to-be-used-soon indicator set.

In some embodiments, an archive for a given cache tag created by a re-fetching cache memory saves just the stored address, sufficient to later re-load an associated line of data, and a validity indication. In other embodiments, the full state of each cache tag is saved. The full state of a cache tag comprises, according to various embodiments, any combination of a validity indication; physical address bits; virtual address bits; way information for set-associative, multi-way caches; a clean/dirty indication; and MESI or other cache coherency state.

In some embodiments, a tag archive is created for a portion less than all of a re-fetching cache memory. In various embodiments, some portions of the re-fetching cache memory continue to be used after the archive is created. For example, using a set-associative, multi-way cache, the archive is created for less than all of the ways of the cache, and other ways are not powered-down and continue to be used. In some embodiments, such as when accesses to the re-fetching cache memory are allowed while the archive is being created, the archive is imprecise in that the archive does not capture a final state of the re-fetching cache memory before placement into a low-power mode.

In some embodiments, cache tag archiving and/or restoring are selective, and solely ones of the cache tags most likely to be later used by a processor are saved and/or restored. For example, using a set-associative, multi-way cache, solely cache tags of tag entries from one or more particular ways in each set are saved and/or restored. According to various embodiments, the particular ways in each set are chosen using items including one or more of: MRU information associated with each set; a cache tag creation-time timestamp; a cache tag last-access-time timestamp; a likely-to-be-used-soon indicator in a cache tag; and a cache tag reference counter. When archiving, the items are associated with the cache tags to be archived. When restoring, the items are associated with the cache tags that have been archived and are being used for restoring. In some embodiments, solely one or more most-recently-used ways are saved and/or restored in each set. In some embodiments, solely cache tags with a recent last-access timestamp are saved and/or restored, regardless of their way, such that the number of ways saved selectively varies in each set. In other embodiments, cache tags with a likely-to-be-used-soon indicator set are saved and/or restored first.

In some embodiments, a fixed number of cache tags, fewer than a total number of tag entries in a cache, are archived and/or restored. In various embodiments, more important cache tags are archived (and/or restored) first. For example, using set-associative, multi-way caches, the most important cache tag from each set is saved (or restored), prior to saving (or restoring) a second cache tag from any set.

In some embodiments, one or more processors are enabled to access an associated cache that is being archived while the archive is being created. In various embodiments, the associated cache is put into a write-through mode while the archive is being created so that continued processor accesses do not create (further) dirty data entries in the associated cache. In some usage scenarios, the archive is imprecise because continued processor accesses change contents of particular tag entries or data entries at an index in the associated cache after one or more cache tags stored in the particular tag entries have been archived.

In various embodiments where one or more processors are enabled to access an associated cache while cache tags are being restored, a cache tag is not restored and the associated line of data is not reloaded if an access by a processor has already referenced the associated line of data and the associated line of data is already stored (in a data entry) in the cache. In some embodiments where one or more processors are enabled to access the associated cache while cache tags are being restored, a cache tag from a tag entry at a given index in the cache is not restored and the associated line of data is not reloaded if accesses by the one or more processors have already filled one or more ways at the given index. For example, using a set-associative, multi-way cache, repopulation uses any available way of the cache for a particular set, and if no ways are available, repopulation of the particular set is stopped.

In some embodiments where one or more processors are enabled to access an associated re-fetching cache memory while tag entries are being repopulated, the tag entries are all set to invalid after the associated re-fetching cache memory is re-enabled. According to various embodiments, the tag entries are set to all invalid by one or more of: a hardware state machine; and firmware running on a processor. In some embodiments where a state machine is used to repopulate the tag entries and to re-fetch corresponding data entries, the state machine accesses the associated re-fetching cache memory at a low priority compared to processor accesses. In some embodiments, the state machine uses one or more independent ports to the tag entries, and proceeds in parallel with processor accesses; in other embodiments, the state machine and the processor compete for access to the tag entries. In some embodiments, processor accesses that access the tag entries, but at a point past where the state machine has re-fetched the corresponding data entries, are forced to miss.

In some embodiments, processor accesses that fill a cache ahead of where a state machine is repopulating tag entries and re-fetching corresponding data entries are identified by the use of a global toggle bit stored in each of the tag entries. If the value of the global toggle bit matches the value of a corresponding bit in a given tag entry, the given tag entry is in a known good state, whereas if the global toggle bit does not match the value of the corresponding bit, the given tag entry is in an in-process state. The global toggle bit value is changed each time the re-fetching cache memory is put in a low-power mode, thus changing the state of all tag entries in the cache from "good" to "in process". Processor accesses that fill tag entries (and the corresponding data entries) ahead of where the state machine is repopulating (and re-fetching) are marked as "good", and the state machine skips any already "good" tag entries that are encountered.

In some embodiments, a tag archive is created by placing tag entries of a re-fetching cache memory into a reduced-power mode where contents of the tag entries are retained but are not accessible. The tag entries are placed in the reduced-power mode after the cache is flushed, and the tag entries are powered-up for accessing before processor accesses to the cache are permitted. In various embodiments, after the tag entries are powered-up, a state machine reads one or more of the tag entries and re-fetches the corresponding data entries.

In some embodiments, a tag archive is created by placing tag entries of a re-fetching cache memory into a non-writable mode where contents of the tag entries are retained but are not modifiable. The tag entries are placed in the non-writable mode after the cache is flushed, and the tag entries are re-enabled for writing before processor accesses to the cache are permitted. In some embodiments, a state machine reads one or more of the tag entries and re-fetches the corresponding data entries. According to various embodiments, the tag entries are re-enabled for writing and a processor is enabled to access the cache either before the state machine begins operation, during the operation of the state machine, or after the completion of the operation of the state machine.

In some embodiments, an archive of cache tags is stored directly into a main memory. According to various embodiments, an address in the main memory used for the archive is one or more of: fixed at boot time for each re-fetching cache memory in the system; and determined dynamically when the archive is created. Repeated archiving of the same re-fetching cache memory uses different addresses (or alternatively the same address) in the main memory for the archive.

In some embodiments, an archive of cache tags is stored to main memory through the memory hierarchy, taking advantage of caching in higher-level portions of the memory hierarchy. For example, in some embodiments, the archive of the cache tags is stored in a fixed region of a higher-level cache, such as at a known index in a data portion of the higher-level cache, independent of any associated memory address. In various embodiments, the fixed index corresponds to one or more ways of the higher-level cache. For example, when one of a plurality of processors associated with the higher-level cache enters a sleep mode, the higher-level cache does not require as much associativity since the processor entering sleep mode is not using the higher-level cache. Concurrent with the processor entering sleep mode, contents of tag entries of a re-fetching cache memory associated with the processor are archived and the cache is put into a low-power mode. One or more ways of the higher-level cache are flushed and disabled for processor and snoop accesses, and the archive is stored in the one or more ways.

In some embodiments, multiple re-fetching cache memories at a same and/or at different levels of a memory hierarchy are archived at or near a same time. In various embodiments, archiving of multiple re-fetching cache memories advantageously creates a combined archive, reducing a size of the combined archive (as compared to separate archives). In some embodiments, combined archiving of two re-fetching cache memories saves a particular cache tag once, even if the particular cache tag is stored in tag entries of each of the two re-fetching cache memories. In further embodiments, contents of the archived version of the particular cache tag comprise an indication of whether the particular cache tag was saved from a first one of the two re-fetching cache memories, the other one of the two re-fetching cache memories, or both of the two re-fetching cache memories.

According to various embodiments, some or all of a data portion of a re-fetching cache memory is flushed and is then put into a low-power mode to save power; re-used for another purpose, or both. When some or all of the data portion of the re-fetching cache memory is put into a low-power mode or is re-used for another purpose, contents of a corresponding tag portion of the re-fetching cache memory are archived. The manner of archiving of the contents of the corresponding tag portion comprises one or more of: saving at least a portion of the contents of the corresponding tag portion in a separate memory; putting at least the corresponding tag portion into a reduced-power mode where contents are retained but are not accessible; and disabling the corresponding tag portion from being written.

According to various embodiments, access of an archive for restoration of cache tags appears to caches of higher-level portions of a memory hierarchy as one or more of: no different (i.e. indistinguishable) from any other memory read or fill from a lower-level cache; and a special access at a known index in a higher-level cache.

According to various embodiments, repopulation of tag entries of a re-fetching cache memory is performed by one or more of: a hardware state machine; and firmware. According to various embodiments, the firmware is one or more of: a thread running on one of the processors in the system; a thread running on a processor that is associated with the re-fetching cache memory; a thread running on a processor that is not associated with the re-fetching cache memory; and run on a diagnostic or control processor. According to various embodiments, the firmware that repopulates the tag entries uses one or more of: diagnostic access paths to access the re-fetching cache memory; special instructions to write the tag entries and to write the corresponding data entries into the re-fetching cache memory; and memory read instructions to fill the cache at the desired locations, a consequence of which is writing the associated tag entries.

According to various embodiments, repopulation of tag entries of a re-fetching cache memory restores one or more of: a same contents the tag entries had when the contents of the tag entries were archived; and a same contents the tag entries had prior to when the re-fetching cache memory was flushed. In some embodiments, a cache tag stored in one of the tag entries that was dirty prior to being flushed is restored in the same dirty state, though an associated line of data is now clean due to the flush. In some embodiments, a cache tag stored in one of the tag entries that was in a particular cache coherency state prior to being flushed is restored in the same particular cache coherency state. According to various embodiments, the restoration of a cache tag involves a cache coherency operation to be executed among one or more of: multiple caches at a same level in a memory hierarchy as the re-fetching cache memory; and one or more caches of portions of a memory hierarchy at a level that is same or higher than the re-fetching cache memory. In various embodiments, the execution of a cache coherency operation as part of the repopulation of a tag entry changes the repopulated contents of the tag entry to be consistent with current state of other caches in a system.

In some embodiments, multiple re-fetching cache memories at a same level of a memory hierarchy are repopulated at a same time. Reloading of associated lines of data selectively takes advantage of shared data among the multiple re-fetching cache memories and retrieves each line of data from a higher-level portion of the memory hierarchy once, even if reloaded into multiple caches. In some embodiments, restoration of a particular cache tag associated with a particular line of data advantageously considers cache coherency state of other cache tags associated with the particular line of data that are either in or are being restored to others of the re-fetching cache memories at the same level of the memory hierarchy. For example, when restoring a particular cache tag associated with a particular line of data and having an archived cache coherency state of exclusive, determining that a peer one of the re-fetching cache memories at the same level of the memory hierarchy contains an other cache tag associated with the particular line of data and having a cache coherency state of shared, enables the restoring of the particular cache tag to use a shared cache coherency state without a need for a cache coherency request to obtain the particular line of data in the exclusive state.

In some embodiments, multiple re-fetching cache memories at different levels of a memory hierarchy are repopulated at or near a same time. Reloading of associated lines of data selectively takes advantage of shared data among the multiple re-fetching cache memories and retrieves each line of data from a higher-level portion of the memory hierarchy once, even if it reloaded into multiple caches at different levels of the memory hierarchy. For example, a re-fetching cache of a higher-level portion of the memory hierarchy starts a repopulation and re-fetch first, so that a subsequent repopulation and re-fetch of a re-fetching cache memory of a lower-level portion of the memory hierarchy takes advantage of the inclusion of some or all required cache tags and/or lines of data in the higher-level re-fetching cache memory.

In some embodiments, a re-fetching cache memory is enabled to archive and repopulate a tag portion and to re-fetch a data portion, and is further enabled for selective power control of all or any part of any combination of the tag and data portions. The tag portion is accessed in response to a command, and proximately in parallel one or more sectors of the data portion are selectively powered up, where a sector is a set of rows in the data portion having individual power control. The powered-up sectors of the data portion are subsequently accessed, and when both the tag portion and the data portion accesses are complete, the tag portion access is used to validate and, for a set-associative, multi-way cache, to select a desired way from the results of accessing the data portion. The one or more sectors of the data portion are then returned to the reduced-power state. In various embodiments, control over which sectors of the data portion are powered up is provided by a subset of bits of an address portion of the command. In some embodiments, the cache is a set-associative, multi-way cache, and one or more sectors each containing one or more ways are powered-up in response to the command. In further embodiments, each sector comprises data entries from multiple ways of the cache.

For further details of selective power control embodiments, see U.S. Provisional Application Ser. No. 60/746,049, filed Apr. 30, 2006, first named inventor Joseph B. Rowlands, and entitled REDUCED POWER CACHE MEMORY WITH PER-SECTOR POWER CONTROL; U.S. Provisional Application Ser. No. 60/747,200, filed May 14, 2006, first named inventor Joseph B. Rowlands, and entitled REDUCED POWER CACHE MEMORY WITH PER-SECTOR POWER CONTROL; U.S. Non-Provisional application Ser. No. 11/740,892, filed, Apr. 26, 2007, first named inventor Joseph Rowlands, and entitled REDUCED-POWER MEMORY WITH PER-SECTOR GROUND CONTROL; and U.S. Non-Provisional application Ser. No. 11/740,901, filed, Apr. 26, 2007, first named inventor Joseph Rowlands, and entitled REDUCED-POWER MEMORY WITH PER-SECTOR POWER/GROUND CONTROL AND EARLY ADDRESS; all owned by the owner of the instant application and all incorporated by reference for all purposes herein.

System

Figure 1B:
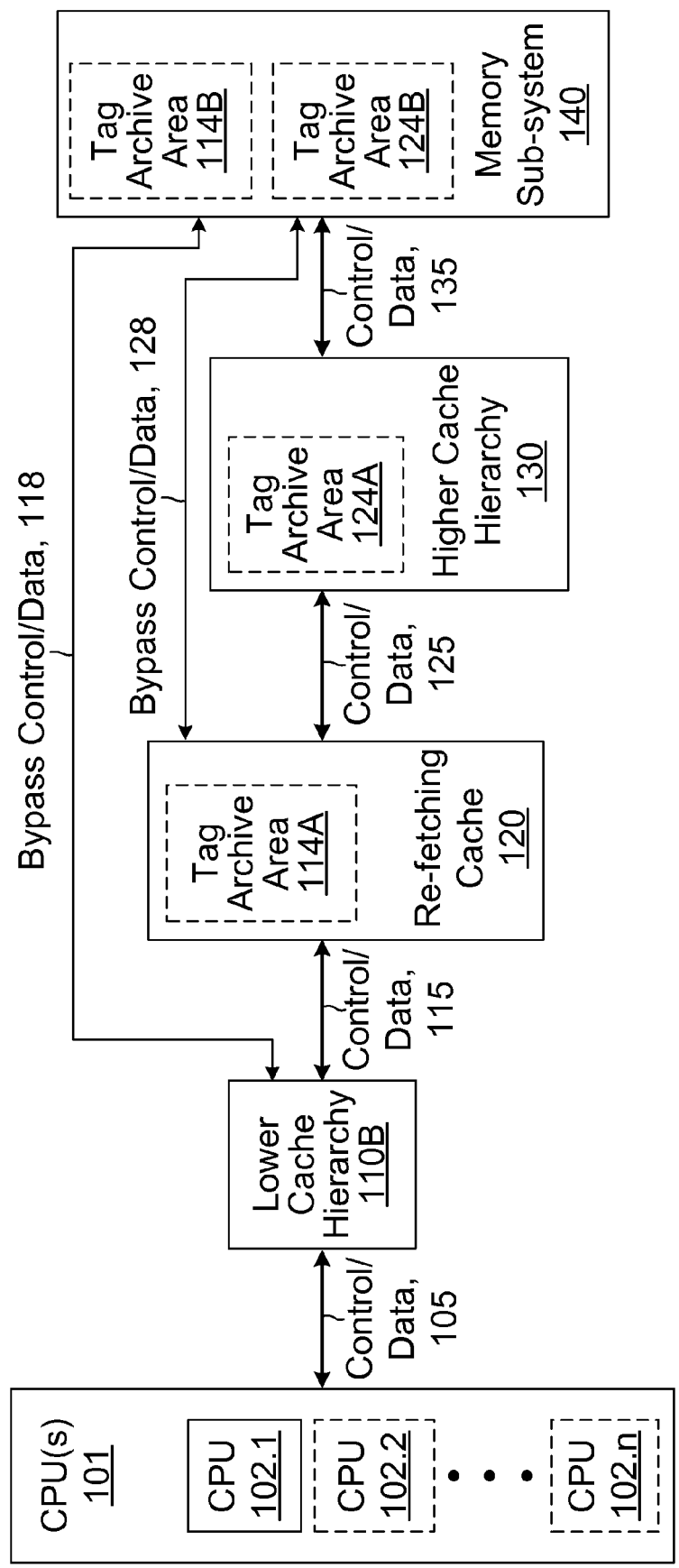
FIG. 1B illustrates selected details of an embodiment of a processor system incorporating multiple levels of re-fetching cache memories as parts of a memory hierarchy.
Figure 1C:
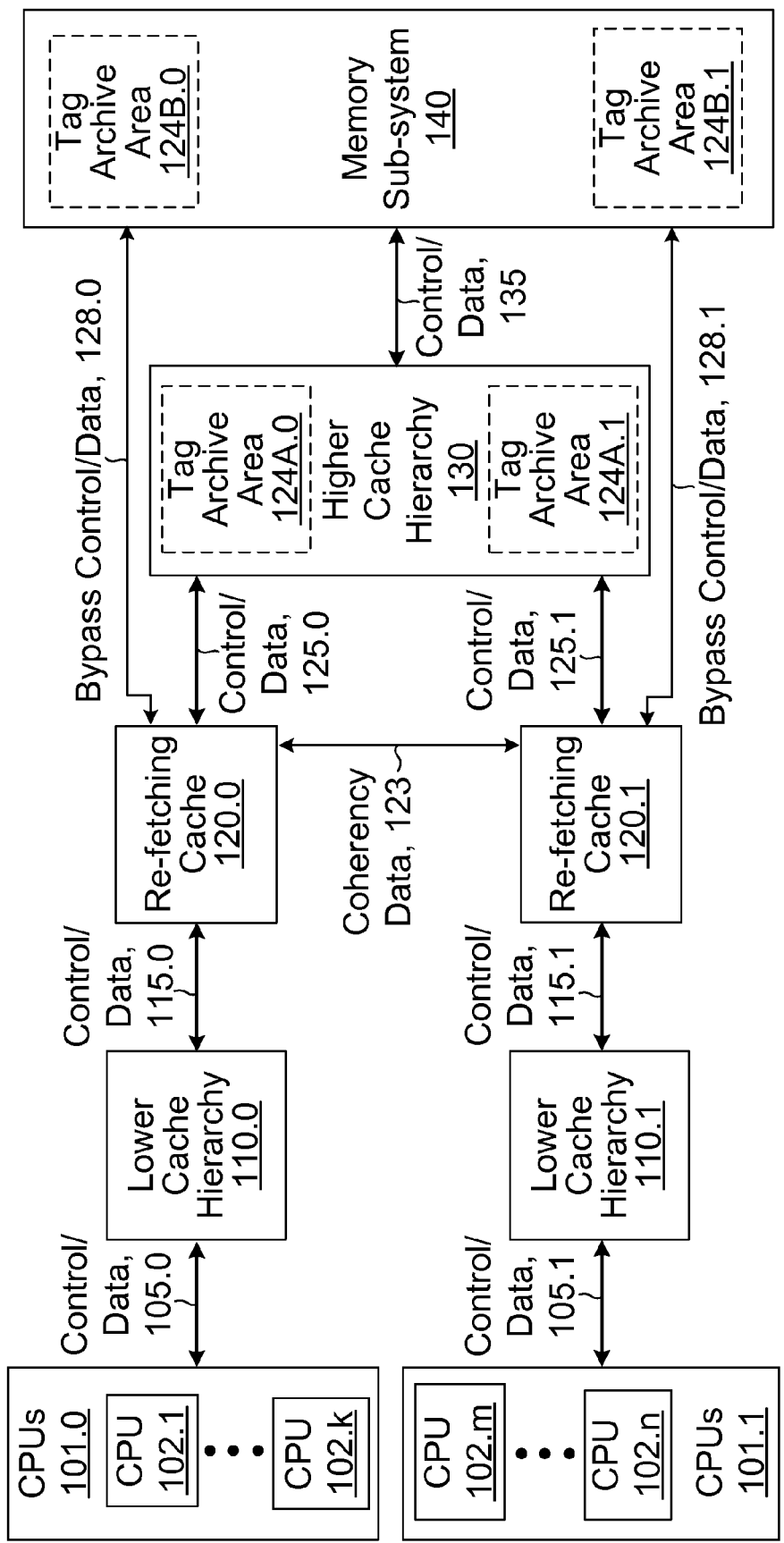
FIG. 1C illustrates selected details of an embodiment of a processor system incorporating multiple re-fetching cache memories at one level of a memory hierarchy.

FIG. 1A illustrates selected details of an embodiment of a system incorporating a re-fetching cache memory as one level of caching in a memory hierarchy. The figure illustrates a multi-core processor chip 100 incorporating a CPU complex 101, containing CPU 102.1, and optionally one or more additional CPUs 102.2-102.$n$, and re-fetching cache memory 120. FIGS. 1B to 1C illustrate embodiments that incorporate multiple re-fetching cache memories, either as in FIG. 1B illustrating re-fetching cache memories as two separate levels of caching in a memory hierarchy, or as in FIG. 1C illustrating re-fetching cache memories in parallel at one level of a memory hierarchy. According to various embodiments, there are more or less levels of memory hierarchy than illustrated, and the re-fetching cache memories are used for any or all of the caches illustrated. In various embodiments, there are more or fewer CPUs than illustrated; the CPUs are all the same type, or are of multiple different types; the CPUs incorporate none, some or all of the levels of the memory hierarchy; the CPUs are arranged in different topologies; the CPUs are associated with different one or ones of the caches; and caches at some levels of the memory hierarchy are directly accessible solely by a subset of the CPUs. All of these variations are within the scope of the techniques outlined herein.

As illustrated in FIG. 1A, CPU complex 101 is coupled to one or more lower-level caches of cache hierarchy 110A via control/data path 105 for communicating CPU accesses with the memory hierarchy. The lower-level caches of cache hierarchy 110A are coupled to re-fetching cache memory 120 via control/data path 115 used, at least in part, to communicate cache misses (and consequent fills) with the lower-level caches of cache hierarchy. The re-fetching cache memory is in turn coupled to one or more higher-level caches of cache hierarchy 130 via control/data path 125 used, at least in part, to communicate cache misses (and consequent fills) with the re-fetching cache memory. The higher-level caches of the cache hierarchy are in turn coupled to memory sub-system 140 via control/data path 135 used, at least in part, to communicate cache misses (and consequent fills) with the higher-level caches of the cache hierarchy. The levels of the cache hierarchy and the memory sub-system compose memory hierarchy 160. In some embodiments, one or more of the levels of the cache hierarchy, including the re-fetching cache memory 120, are coupled to CPU complex 101 by direct control paths 151, 152, and 153. In some embodiments, memory sub-system 140 is coupled to CPU complex 101 via direct control path 154. The direct control paths are optionally provided in some embodiments to enable any combination of diagnostic functions; diagnostic accesses including alternate read and write paths; and out-of-band control communications. For example, direct control path 152 enables one or more of CPUs 102.1-102.$n$ to directly access tag array 121 or data array 122 of re-fetching cache memory 120 for diagnostic or control purposes. In some embodiments, such out-of-band accesses are used by a processor to read tag entries in re-fetching cache memory 120 to create an archive, or to write the tag entries for repopulation.

As illustrated in FIG. 1A, re-fetching cache memory 120 comprises a tag array 121, a data array 122, and re-fetch controls 123. The tag array comprises a plurality of tag entries, and the data array comprises a plurality of data entries. In addition, the re-fetching cache memory comprises circuitry necessary to implement a cache. In some embodiments, the circuitry necessary to implement a cache comprises: circuitry to look up an entry in tag array 121; circuitry to compare the result of the tag array access to determine if there is a hit or a miss; circuitry to look up an entry in data array 122 and return the entry for a hit; and circuitry to process misses by issuing a request to a higher-level portion of the memory hierarchy via control/data path 125 and to process a later return of fill data to complete the miss. In some embodiments, the circuitry necessary to implement a cache processes multiple outstanding misses at one time. In various embodiments, the circuitry necessary to implement a cache comprises cache coherency circuitry enabled to interpret a current and a desired cache coherency state of a line of data stored in one of the data entries and to execute a necessary cache coherency operation among multiple caches at the same or at other levels in the memory hierarchy to achieve the desired cache coherency state for the line of data.

Continuing in FIG. 1A, in various embodiments, re-fetching cache memory 120 is commanded to create an archive of at least some of the contents of tag array 121, or to repopulate tag array 121 and re-fetch the corresponding data entries into data array 122 by one of CPUs 102.1-102.$n$ or by other control means not illustrated. In some embodiments, a state machine as part of re-fetch control 123 directs archive creation. In some embodiments, a state machine as part of re-fetch control 123 directs repopulation of tag array 121 and re-fetching of corresponding data entries into data array 122. In various embodiments, re-fetch control 123 is a simple datapath and sequencing of operations to create the archive or to repopulate the tag array and to re-fetch the corresponding data entries is controlled by one of CPUs 102.1-102.$n$ or by other control means not illustrated. For example in some embodiments, re-fetch control 123 enables a CPU to read or to write tag array 121 via direct control path 152, thus enabling the CPU to create the archive, and to repopulate the tag array. In other embodiments, re-fetch control 123 is provided with a command over direct control path 152, and a state machine in re-fetch control 123 sequences over tag array 121 to create an archive, or to repopulate the tag array. In some embodiments, CPUs 102.1-102.$n$ run firmware (or software), illustrated as object code 103, stored on disk 104, to create the archive, and/or repopulate the tag entries, and/or re-fetch the corresponding data entries. In various embodiments, disk 104 is coupled to CPU complex 101 in other fashions not illustrated in FIG. 1A, including: through a cache coherent I/O controller; through a DMA device to the memory sub-system; and through an additional port to memory sub-system 140.

FIG. 1A also illustrates some possible locations where an archive of at least some of the contents of tag array 121 is, according to various embodiments, created, and the paths that are used for creation and/or repopulation. Various embodiments as described above create the archive in places other than those illustrated in FIG. 1A. In one embodiment, at least some of the contents of tag array 121 is archived in a cache of a higher-level portion of the memory hierarchy, such as in tag archive area 124A via control/data path 125. Tag archive area 124A represents either storing the archive at a determined location in higher-level caches of cache hierarchy 130, such as at a fixed index in a cache, or represents storing the archive at a determined memory address using the memory access data paths in the cache hierarchy. In some embodiments of the memory address case, tag archive area 124A is distributed due to caching over multiple levels of the memory hierarchy, including various other portions of higher-level caches of cache hierarchy 130 and portions of memory sub-system 140. In other embodiments, at least some of the contents of tag array 121 is archived directly in memory sub-system 140, such as in tag archive area 124B via bypass control/data path 128.

In some embodiments using tag archive area 124A, tag array 121 is repopulated by re-fetch control 123 reading the archive using control/data path 125. In other embodiments, tag array 121 is repopulated by a CPU reading the archive using direct control path 153, and writing to the tag array using direct control path 152.

In some embodiments using tag archive area 124B, tag array 121 is repopulated by re-fetch control 123 reading the archive using bypass control/data path 128.

In some embodiments, data entries of data array 122 are re-fetched based on the corresponding repopulated tag entries in tag array 121 using control/data path 125, similar to any other cache fill request for re-fetching cache memory 120. In some embodiments, a cache coherency operation among multiple caches at the same or at other levels of the memory hierarchy is executed as part of a cache fill request.

In some embodiments, data entries in data array 122 are re-fetched based on the corresponding repopulated tag entries in tag array 121 using bypass control/data path 128.

In some embodiments, when tag entries of re-fetching cache memory 120 are repopulated and the corresponding data entries are re-fetched, cache coherency operations are executed to ensure that reloaded lines of data are consistent with any higher-level caches of the cache hierarchy. For example, if data entries are re-fetched via bypass control/data path 128, then the reloaded lines of data are made consistent with any copies that are stored in higher-level caches of cache hierarchy 130.

FIG. 1B illustrates a memory hierarchy containing two re-fetching cache memories, 110B and 120, at different levels of the memory hierarchy. In some embodiments, tag archive area 114A for lower-level re-fetching cache memory 110B is contained inside of higher-level re-fetching cache memory 120. In some embodiments, tag archive area 114A is written using a conventional write path (also called a spill path) from lower-level re-fetching cache memory 110B to higher-level re-fetching cache memory 120. In other embodiments, tag archive area 114A is written using a special write command to save contents of the tag entries directly to higher-level re-fetching cache memory 120 at a determined index in the higher-level cache. In some embodiments, the archive for lower-level re-fetching cache memory 110B is stored directly to memory sub-system 140 via bypass control/data path 118, and is saved in tag archive area 114B. In other embodiments, the archive for lower-level re-fetching cache memory 110B is stored directly to tag archive area 114B in memory sub-system 140 via control/data paths 115, 125, and 135 by treating the archive information as write-through data sent through to the memory sub-system.

In some embodiments, when tag entries for re-fetching cache memories 110B and 120 are repopulated and the corresponding data entries are re-fetched by reloading lines of data associated with cache tags stored in the tag entries, re-fetching cache memory 120 is repopulated and re-fetched prior to re-fetching lower-level re-fetching cache memory 110B. If re-fetching lower-level re-fetching cache memory 110B uses tag archive area 114A, then re-fetching the data entries for re-fetching cache memory 120 prior to repopulating lower-level re-fetching cache memory 110B enables the repopulation accesses (restoring cache tags into tag entries) for lower-level re-fetching cache memory 110B to hit in re-fetching cache memory 120. In addition, re-fetching the data entries for re-fetching cache memory 120 prior to re-fetching data entries for lower-level re-fetching cache memory 110B enables the re-fetching accesses for lower-level re-fetching cache memory 110B to hit in re-fetching cache memory 120.

In some embodiments, when the tag entries for re-fetching lower-level re-fetching cache memory 110B are repopulated and the corresponding data entries are re-fetched, cache coherency operations are executed to ensure that reloaded data is consistent with any higher-level caches of the cache hierarchy. For example, if lines of data are reloaded via bypass control/data path 118, those lines of data are made consistent, via cache coherency operations, with any copies that are stored in re-fetching cache 120 and higher-level caches of cache hierarchy 130.

FIG. 1C illustrates a memory hierarchy containing two re-fetching cache memories, 120.0 and 120.1, at the same level of the memory hierarchy. CPUs 102.1-102.$k$ are associated with re-fetching cache memory 120.0, and CPUs 102.$m$-102.$n$ are associated with re-fetching cache memory 120.1. In some embodiments, CPUs 102.1-102.$k$ are enabled to optionally access re-fetching cache memory 120.1, and CPUs 102.$m$-102.$n$ are enabled to access re-fetching cache memory 120.0, via a direct control path, similar to direct control path 152 illustrated in FIG. 1A. Each of the two re-fetching cache memories 120.0 and 120.1 has a respective tag archive area. In some embodiments where the cache tags are archived in a higher-level cache memory as described above, tag archive areas 124A.0 and 124A.1 are used. In other embodiments where the cache tags are archived in the memory sub-system as described above, tag archive areas 124B.0 and 124B.1 are used.

In some embodiments where one of re-fetching cache memories 120.0 and 120.1 is being repopulated at a given time, cache coherency operations are executed to ensure reloaded data is consistent with other caches in the cache hierarchy. In some embodiments, coherency data path 123 is used to communicate cache coherency operations among caches at a same level of the cache hierarchy. In various embodiments where lines of data are reloaded from higher-level caches of the cache hierarchy using fill operations, similar to fill operations performed in response to processor accesses that miss, the cache coherency operation is a natural consequence of the fill operations. In other embodiments where lines of data are reloaded from memory sub-system 140 using bypass control/data paths 128.0 and 128.1, separate cache coherency operations are optionally executed to ensure consistency among caches at the same and/or at other levels of the cache hierarchy.

All or any portions of CPUs, caches (including one or more re-fetching caches), and memory-subsystems as illustrated by FIGS. 1A-C are implemented, according to various embodiments, in one or more integrated circuits. For an example with respect to FIG. 1C, CPUs 102.1-k, lower-level caches of cache hierarchy 110.0, and re-fetching cache 120.0 are implemented in a multi-core processor. Continuing with the example, CPUs 102.m-n, lower-level caches of cache hierarchy 110.1, and re-fetching cache 120.1 are implemented in another multi-core processor. For another example with respect to FIG. 1B, CPUs 101, re-fetching lower-level re-fetching cache memory 110B, re-fetching cache 120, and higher-level caches of cache hierarchy 130 are implemented in a single multi-core processor. Other single and multi-chip integrated circuit embodiments are contemplated.

Re-Fetching Cache Operation

Figure 2:
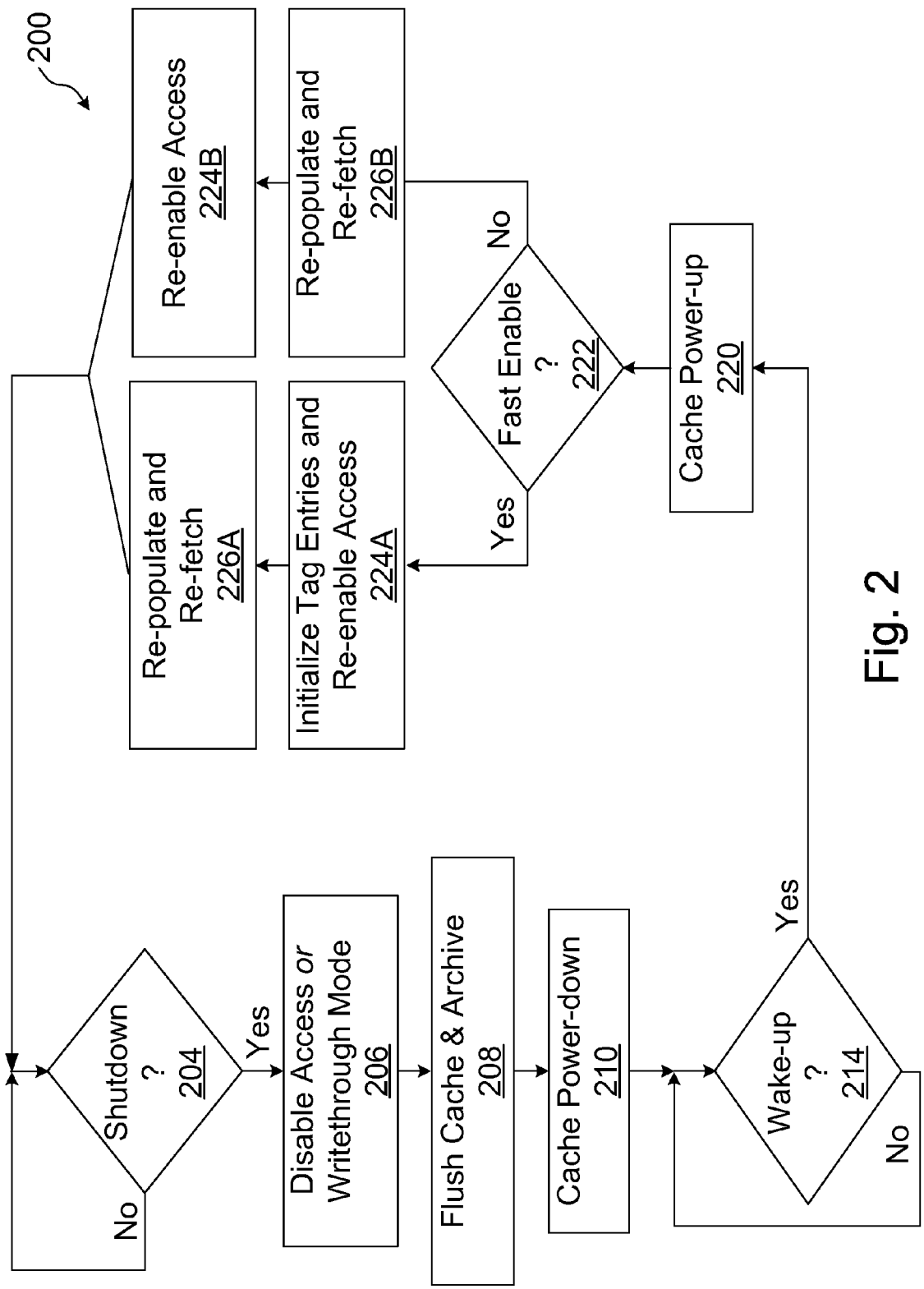
FIG. 2 illustrates selected details of a process used in an embodiment to control operation of a re-fetching cache memory.

FIG. 2 illustrates a process 200 used in an embodiment to control operation of a re-fetching cache memory. When the re-fetching cache memory is active, the process uses decision operation 204 to determine if a shutdown of the re-fetching cache memory is commencing, either staying in decision operation 204 if there is no imminent shutdown, or proceeding to operation 206 if a shutdown is initiated. In some embodiments, the re-fetching cache memory is shut down when one or more associated CPUs enter or are about to enter a sleep mode. In operation 206, the re-fetching cache memory is either disabled, preventing any CPU accesses, or is put into a write-through mode so that subsequent accesses do not create (further) dirty data entries, though the accesses optionally change the contents of tag entries and of the data entries.

Processing continues with operation 208, where the cache is flushed and an archive is created from (at least some of) the cache tags stored in the tag entries. If the re-fetching cache memory was put into a write-through mode and was not disabled, then the archive is not necessarily precise, since the cache tags optionally change due to CPU accesses during the archiving. There is no essential ordering required for the flushing and archiving, either of these operations as a unit, or considered for each tag entry and the corresponding data entry. In some embodiments where a precise archive is made, the cache is disabled for CPU accesses, and contents of a given tag entry are archived prior to a selective flush of the corresponding data entry. In other embodiments, a precise archive is made by recording contents of a given tag entry prior to a flush of the corresponding data entry, and archiving the recorded contents.

Processing then continues with operation 210, where the re-fetching cache memory is put into a low-power mode. In some embodiments, the low-power mode turns off all power to the re-fetching cache memory. In other embodiments, the low-power mode turns off power to a data portion of the re-fetching cache memory, and puts a tag portion into a reduced-power mode.

After operation 210, decision operation 214 determines if it is time to wake up the re-fetching cache memory, staying in decision operation 214 until a wake-up is required. In some embodiments, the re-fetching cache memory is woken up when one or more associated CPUs exit a sleep mode. If the re-fetching cache memory is to be woken up, processing continues with operation 220, where the re-fetching cache memory is powered up. In some embodiments, powering up the re-fetching cache memory calls for delay states or timed delays to ensure that the re-fetching cache memory is awake and usable prior to proceeding.

Processing continues with decision operation 222, which, according to various embodiments, represents a static choice between one of two wake-up strategies. In some embodiments operation 222 represents a dynamic decision based on mode information. In a fast-enable wake-up strategy or mode, processing continues with operations 224A and 226A, whereas in a delayed-enable wake-up strategy or mode, processing continues with operations 226B and 224B.

In the fast-enable wake-up strategy, operation 224A ensures the tag entries have some meaningful and consistent state, such as being all invalid, and then re-enables the re-fetching cache memory to be used by one or more associated CPUs. The one or more associated CPUs are then enabled to use the re-fetching cache memory. Processing continues with operation 226A, which takes place in parallel with CPU accesses to the re-fetching cache memory. In operation 226A, the tag entries of the re-fetching cache memory are repopulated and the corresponding data entries are re-fetched by reloading lines of data associated with cache tags stored in the tag entries. In some embodiments, cache coherency operations are executed as the lines of data are reloaded to ensure that the data is also consistent with other caches in the cache hierarchy. In some embodiments, techniques such as the global toggle bit described above are used to ensure the associated CPUs are enabled to access the re-fetching cache memory in parallel with operation 226A.

In the delayed-enable wake-up strategy, operation 226B first repopulates the tag entries of the re-fetching cache memory and re-fetches the corresponding data entries by reloading lines of data associated with cache tags stored in the tag entries. In some embodiments where not all of the tag entries are repopulated, tag entries not repopulated are marked as invalid. The lines of data are reloaded in a manner that ensures consistency with other caches in the system. Repopulating the tag entries and re-fetching the corresponding data entries ensures that all the tag entries have valid contents and that the data entries are consistent with the tag entries. In some embodiments, cache coherency operations are executed as the lines of data are reloaded to ensure that the data is also consistent with other caches in the cache hierarchy. Processing then continues with operation 224B, where the re-fetching cache memory is re-enabled for access by one or more associated CPUs.

Whether the fast-enable wake-up strategy or the delayed-enable wake-up strategy is used, processing then returns to decision operation 204 with the re-fetching cache memory enabled and operational, and process 200 awaiting another shutdown.

FIG. 3A illustrates a process 208 used in an embodiment of a re-fetching cache memory to flush the cache and to archive the cache tags. The process starts in operation 302, and proceeds to operation 304 where an index is initialized to zero. As described, the process uses a single index to access all of the tag entries, as would be the case for a direct-mapped cache, or for any cache providing a diagnostic or other path to access all of the tag entries with a sequential index. Processing continues with decision operation 306, where a tag entry at the current index is accessed, and a determination is made as to whether contents of the tag entry indicate that the corresponding data entry is dirty or not. If the corresponding data entry is dirty, processing continues to operation 308, where the corresponding data entry is flushed from the cache. If the corresponding data entry is not dirty, operation 308 is skipped. In either case, processing then continues with operation 310.

In operation 310, the contents of the tag entry at the current index is archived. In some embodiments, the contents saved for the tag entry at the current index indicate a state (such as a coherency state) of the corresponding data entry at decision operation 306, prior to a possible flush of the corresponding data entry at operation 308. Processing proceeds with decision operation 312, where it is determined if there are more tag entries left to process. In some embodiments, the determination is based on the number of tag entries processed, and processing optionally terminates before all the tag entries have been processed. In some embodiments, the determination is based on importance of the remaining, un-processed tag entries. If there are no more tag entries left, the process ends at operation 320. If there are more tag entries left to process, then processing continues with operation 314 which increments the index and then returns to decision operation 306.

While FIG. 3A illustrates an embodiment of process 208 using a single index variable to access the tag entries and the corresponding data entries in a sequential fashion, other embodiments use different indexing schemes. In some embodiments, the tag entries are accessed in a particular order so that more important cache tags are archived first. In various embodiments, the tag entries are accessed with dual indices, one for sets and one for ways.

Figure 3B:
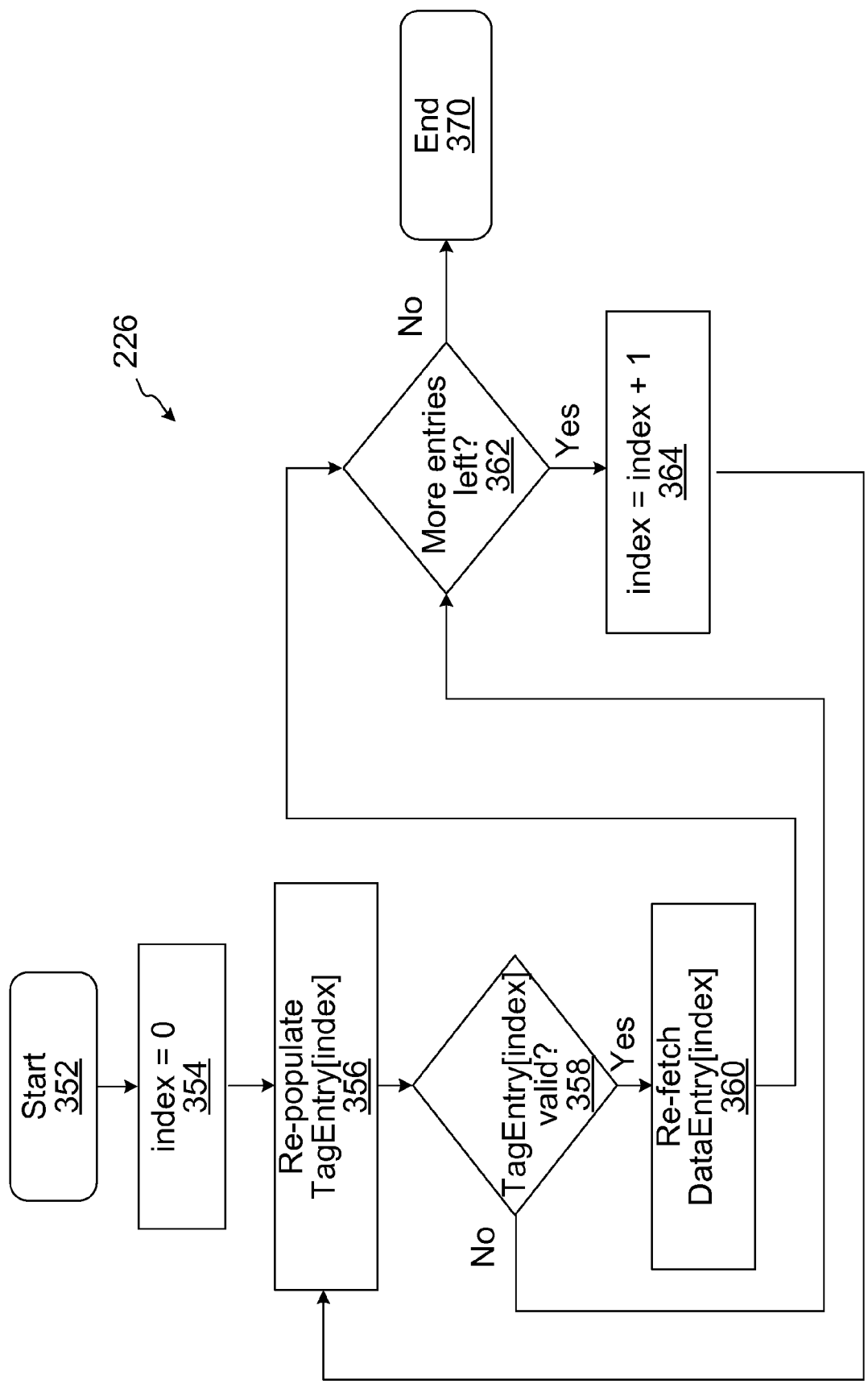
FIG. 3B illustrates selected details of a process used in an embodiment of a re-fetching cache memory to repopulate the tag entries and to re-fetch corresponding the data entries.

FIG. 3B illustrates process 226 used in an embodiment of a re-fetching cache memory to repopulate the tag entries and to re-fetch the corresponding data entries. The process starts in operation 352, and proceeds to operation 354 where an index is initialized to zero. Processing continues with operation 356 where a tag entry at the current index is repopulated by reading contents of the archive for that index and restoring the contents into the tag entry. Processing then proceeds to decision operation 358, where the repopulated tag entry is checked for validity. If the repopulated tag entry is valid, then processing continues with operation 360 where the corresponding data entry is re-fetched; processing then proceeds to decision operation 362. If the repopulated tag entry is not valid, then processing skips operation 360 and continues with decision operation 362. In some embodiments, the re-fetching of the corresponding data entry in operation 360 comprises a cache coherency operation.

Processing proceeds with decision operation 362, where it is determined if there are more tag entries left to process. In some embodiments, the determination is based on the number of tag entries processed, and processing optionally terminates before all the tag entries have been processed. In some embodiments, the determination is based on importance of the remaining, un-processed tag entries. If there are no more tag entries left, then the process ends at operation 370. If there are more tag entries left to process, then processing continues with operation 364 which increments the index and then returns to operation 356.

While FIG. 3B illustrates an embodiment of process 226 using a single index variable to access the tag entries and the corresponding data entries in a sequential fashion, other embodiments use different indexing schemes. In some embodiments, the tag entries are accessed in a particular order so that more important cache tags are archived first. In various embodiments, the tag entries are accessed with dual indices, one for sets and one for ways.

Selected Hardware Techniques

In some embodiments, various combinations of all or portions of functions performed by a re-fetching cache memory (such as re-fetching cache 120 of FIG. 1A), a tag archive area (such as tag archive areas 124A and 124B of FIG. 1A), a memory hierarchy (such as memory hierarchy 160 of FIG. 1A), and portions of a processor or a microprocessor providing all or portions of the aforementioned functions, are specified by descriptions compatible with processing by a computer system. The specification is in accordance with various descriptions, such as hardware description languages, circuit descriptions, netlist descriptions, mask descriptions, or layout descriptions. Example descriptions include: Verilog, VHDL, SPICE, SPICE variants such as PSpice, IBIS, LEF, DEF, GDS-II, OASIS, or other descriptions. In various embodiments the processing comprises any combination of interpretation, compilation, simulation, and synthesis to produce, to verify, or to specify logic and/or circuitry suitable for inclusion on an integrated circuit. The integrated circuit, according to various embodiments, is designed and/or manufactured according to a variety of techniques. The techniques comprise a programmable technique (such as a field or mask programmable gate array integrated circuit), a semi-custom technique (such as a wholly or partially cell-based integrated circuit), and a full-custom technique (such as an integrated circuit that is substantially specialized), any combination thereof, or any other technique compatible with design and/or manufacturing of integrated circuits.

Example Embodiments

In a first example embodiment, a system comprises a re-fetching cache memory comprising a plurality of tag entries each enabled to store a respective cache tag, and a plurality of data entries each enabled to store a respective line of data, each tag entry corresponding to one of the data entries, and each respective cache tag associated with the respective line of data. The tag entries compose a tag portion of the re-fetching cache memory. The data entries compose a data portion of the re-fetching cache memory. According to various embodiments, at least a portion of the respective cache tags are archived in a tag archive area prior to the re-fetching cache memory entering one or more of: a disabled mode; and an alternative mode to be re-used for another purpose. In various embodiments, the re-use for another purpose uses one or more of the data entries as a portion of a graphics buffer. In some embodiments, prior to entering the alternative mode, at least a first processor is enabled to access the re-fetching cache memory, and the re-use for another purpose enables at least a second processor to access the re-fetching cache memory. In further embodiments, the tag archive area is a first archive, the first processor accesses the first archive, and the second processor accesses a second archive. In still further embodiments, the accesses are related to one or more of creating, using, reading, writing, and managing the respective archive. In some embodiments, the second processor comprises one or more graphics processors, and the one or more graphics processors are enabled to directly access the data portion. In some embodiments, control logic manages accesses to the cache from the first processor and from the second processor. In a first example, the control logic arbitrates accesses to a single port of the cache from the first processor and from the second processor. In a second example, the control logic directs accesses from the first processor and from the second processor to respective selected ones of a plurality of ways of the cache.

In some embodiments, as a function of entering the disabled and/or the alternative modes, at least a portion of the data entries are flushed. In various embodiments, the flushing of a data entry is selective, based upon a cache state of the associated line of data stored in the data entry, the cache state stored in a corresponding tag entry. In some embodiments, as a function of exiting the disabled and/or the alternative modes, at least a portion of the cache tags are restored from the tag archive area into at least some of the tag entries (repopulating the at least some of the tag entries), and at least a portion of lines of data associated with the restored cache tags are reloaded into corresponding data entries (re-fetching the corresponding data entries). According to various embodiments, information of a given cache tag in the tag archive area comprise one or more of: a dirty indication of the associated line of data; and a cache coherency state of the associated line of data. According to various embodiments, the restoring for the given cache tag in the tag archive area restores one or more of: the previous dirty indication of the associated line of data; and the previous cache coherency state of the associated line of data. In further embodiments, restoring the previous cache coherency state executes a cache coherency operation among multiple caches. According to various embodiments, in response to the cache coherency operation, an associated line of data is restored to a shared state from one of: an exclusive state; and a modified state.

According to various embodiments, the restoring and/or the reloading are performed, at least in part, by one or more of: a hardware state machine; a control processor; a first thread running on a particular processor in the system; and one or more processors in the system. In various embodiments, the one or more processors include one or more diagnostic/control processors. In some embodiments, the one or more processors are a first one or more processors distinct from a second one or more processors, and prior to entering the disabled and/or alternative modes, at least the second one or more processors are enabled to access the re-fetching cache memory. According to various embodiments, one or more of the restoring and the reloading is at a lower priority than a memory access to the re-fetching cache memory by one or more of: a second thread running on the particular processor; a thread running on one of the second one or more processors; and any of the second one or more processors.

In some embodiments, the tag archive area is contained in a cached region of memory. According to various embodiments, the tag archive area is one or more of: contained, at least in part, in a main memory of the system; at least a portion of the tag entries; and stored in a data portion of a higher-level cache. In some embodiments, the storing is according to an index into the data portion of the higher-level cache. In further embodiments, the restoring reads the tag archive area from the data portion of the higher-level cache at the index. According to various embodiments, the index is provided by one or more of: the higher-level cache; an agent directing the creation of the archive; and an agent independent from the higher-level cache. In various embodiments, the reloading uses a path from the re-fetching cache memory to a higher-level cache that is also used for cache misses, and/or the reloading operates as a cache fill.

In some embodiments, the creation of the archive uses a path from the re-fetching cache memory to a higher-level cache that is also used for cache spills. According to various embodiments, the creation of the archive comprises one or more of: copying at least a portion of contents of at least some of the tag entries to a memory, such as a low-power memory; preventing modifications to at least a portion of the tag entries; placing at least a portion of the tag entries in a non-writable mode; and placing at least a portion of the tag entries in a reduced-power mode. In further embodiments, the tag archive area is the at least a portion of the tag entries. According to various embodiments, the repopulating comprises one or more of: directing the at least a portion of the tag entries to exit the reduced-power mode; directing the at least a portion of the tag entries to exit the non-writable mode; exiting the at least a portion of the tag entries from the reduced-power mode; exiting the at least a portion of the tag entries from the non-writable mode; and enabling modifications to the at least a portion of the tag entries. In some embodiments, the re-fetching cache memory is enabled to be accessed by one or more processors while the archive is being created. In some embodiments, the re-fetching cache memory is in a write-through mode at least part of the time the archive is being created.

In some embodiments, the re-fetching cache memory is enabled to be accessed by one or more processors at least partially overlapping in time with one or more of the restoring and the reloading. In further embodiments, a line of data that has been allocated a data entry in the re-fetching cache memory by a processor access prior to the restoring and the reloading of the line of data is skipped during the restoring and the reloading.

In some embodiments, the re-fetching cache memory is a set-associative, multi-way cache. In further embodiments, the cache tags are restored into an available way. In still further embodiments, the restoring terminates when all ways of a set are in use.

In some embodiments, contents of a particular portion of the tag entries are saved in the tag archive area. In further embodiments, the particular portion is limited in number to a size less than the number of tag entries. According to various embodiments, the particular portion includes tag entries storing one or more of: solely recently accessed cache tags; solely cache tags that are not among the least-recently used; and cache tags having a likely-to-be-used-soon indicator set. In various embodiments, the recently accessed cache tags are denoted with a timestamp indicating a recent access. In some embodiments where the re-fetching cache memory is a set-associative, multi-way cache having a plurality of sets, the particular portion is determined in a set-index-first, way-second fashion, and at least one particular cache tag from each set is saved prior to saving a second cache tag from any of the sets.

According to various embodiments, information of a given cache tag in the tag archive area comprise one or more of: most-recently-used information; timestamp information; and a likely-to-be-used-soon indicator. According to various embodiments, one or more of the restoring and the reloading is responsive to one or more of: the most-recently-used information; the timestamp information; and the likely-to-be-used-soon indicator. In some embodiments, the restoring solely restores cache tags with a timestamp in a particular range. In various embodiments, the restoring restores cache tags with a likely-to-be-used-soon indicator set prior to restoring other cache tags.

In some embodiments, the re-fetching cache memory is a set-associative, multi-way cache having a plurality of sets, each of the sets having a corresponding plurality of ways, and where the tag entries in a given one of the sets are repopulated in a particular order until the ways of the given set are all populated. In further embodiments, processor accesses to lines of data while the tag entries are being repopulated, allocate tag entries and corresponding data entries in some of the ways, and prevent some of the tag entries from being repopulated. According to various embodiments, the particular order is determined, at least in part, by information in cache tags being restored, the information comprising one or more of: most-recently-used first; more-recent-timestamp first; and likely-to-be-used-soon indicator set first. In various embodiments, the particular order is further set-index-first, way-second, and one or more most-recently-used (or, in other embodiments, more-recent-timestamp or likely-to-be-used-soon indicator set) cache tags archived from each set are restored prior to restoring a second cache tag archived from any of the sets.

In some embodiments, the re-fetching cache memory is a first re-fetching cache memory, and the system further comprises a second re-fetching cache memory at, according to various embodiments, a level that is the same or higher (with respect to the first re-fetching cache memory) in a cache hierarchy. In some embodiments, the second re-fetching cache memory is repopulated prior to the repopulating of the first re-fetching cache memory; and at least a portion of the repopulating and the reloading (of the first re-fetching cache memory) is responsive to information provided by the second re-fetching cache memory. In some embodiments, the second re-fetching cache memory is repopulated at least partially while the first re-fetching cache memory is being repopulated. In further embodiments, a retrieval of one or more lines of data from a higher-level portion of the memory hierarchy for reloading into the first re-fetching cache memory is also used for reloading into the second re-fetching cache memory.

In some embodiments, the tag entries have a first read datapath for accesses to the re-fetching cache memory from a lower-level portion of a memory hierarchy, and the tag entries have a second read datapath for the creation of the archive.

In a second example embodiment, a system comprises: a first memory comprising a tag portion and a data portion, the tag portion comprising a plurality of tag entries and the data portion comprising a plurality of data entries, each tag entry being associated with a corresponding one of the data entries; a second memory; and a controller enabled, in response to an event, to store at least a portion of contents of each of more than one tag entry in the second memory. In some embodiments, the first memory is enabled to operate according to a mode, and the event is a change in the mode of the first memory. According to various embodiments, the mode is one of a plurality of modes comprising one or more of: a cache mode compatible with processing accesses from a general purpose processor; a buffer mode compatible with processing accesses from a graphics processor; a direct-memory-access mode compatible with processing accesses from a direct memory access controller; a disabled mode incompatible with processing accesses; and a powered-down mode.

In some embodiments, the first memory further comprises access control circuitry enabled to process access requests from a processor. In some embodiments, the system further comprises the processor. In further embodiments, the access control circuitry is further enabled to operate the first memory as a cache accessible by the processor. In some embodiments, the system comprises a cache hierarchy that comprises the cache. According to various embodiments, the cache is one or more of: a first-level cache; a second-level cache; a third-level cache; an innermost cache; and an outermost cache.

In some embodiments, the cache is a first cache; and the system further comprises a second cache. In various embodiments, the second cache comprises the second memory. According to various embodiments, the cache hierarchy comprises one or more of: at least one level, where the first and the second caches are at the one level; and at least two levels, where the first and the second caches are at respective ones of the levels.

According to various embodiments, the system further comprises one or more of: a microprocessor comprising the processor; a single-core microprocessor comprising the processor; and a multi-core microprocessor comprising the processor.

In some embodiments, the processor is a first processor, and the system further comprises a second processor. In various embodiments, the access control circuitry is further enabled to process access requests from the second processor. In various embodiments, the second processor comprises the controller. In various embodiments, the controller comprises the second processor. According to various embodiments, the controller is implemented, at least in part, by one or more of: a hardwired state machine; and the second processor. In various embodiments, the controller is enabled to operate, at least in part, by firmware running on the second processor.

In a third example embodiment, a system comprises: a cache comprising a tag portion and a data portion, the tag portion comprising a plurality of tag entries and the data portion comprising a plurality of data entries, each tag entry associated with a corresponding one of the data entries; an archive interface adapted to read and write the tag entries; and a second memory in which an archive of contents of the tag entries is created using the archive interface to access the tag entries. In some embodiments, the read portion of the archive interface is the same as a diagnostic interface. In some embodiments, the write portion of the archive interface is the same as a cache fill interface. In various embodiments and/or usage scenarios, at least a portion of the cache is flushed prior to creating the corresponding part of the archive. In various embodiments, at least a portion of the archive is used to repopulate at least a portion of the tag entries and to re-fetch the corresponding data entries.

In some embodiments, the system further comprises a processor enabled to access the cache as a part of a primary path of the processor to a memory system. In further embodiments, the processor is enabled to access the cache at least a portion of the time while the archive is being created. In still further embodiments, the cache is in a write-through mode at least part of the time the archive is being created. In some embodiments, the processor is one of a plurality of processors in a multi-core processing chip. According to various embodiments, the cache is one or more of: a first-level cache; a second-level cache; a third-level cache; an innermost cache; and an outermost cache. In further embodiments, one or more other processors in the plurality of processors are also enabled to access the cache as a part of a primary path of the other processors to the memory system.

In some embodiments, the processor is a first processor, a second processor is coupled to both the archive interface and the second memory, and the archive is created under control of the second processor. In various embodiments, the second processor is enabled to access the cache as a part of a primary path of the second processor to the memory system. In further embodiments, the second processor is a control processor.

In some embodiments, the system further comprises a cache hierarchy that comprises the cache. In further embodiments, the cache is a first cache; and the system further comprises a second cache. According to various embodiments, the first cache and the second cache are at either: the same level of the cache hierarchy; and adjacent levels of the cache hierarchy. In further embodiments, the first cache and the second cache are communicatively coupled for the purpose of exchanging cache coherency information. In some embodiments, the second cache comprises the second memory.

In a fourth example embodiment, a method comprises: reading more than one tag entry of a plurality of tag entries, the tag entries being associated with corresponding data entries, the tag entries enabled to store a respective cache tag, the data entries enabled to store a respective line of data, and the respective cache tag associated with the respective line of data; and saving at least a portion of contents of the more than one tag entry to a cache tag archive. According to various embodiments, the method further comprises one or more of: flushing, prior to the saving, more than one corresponding data entry; repopulating one or more of the more than one tag entry from the cache tag archive; and reloading one or more lines of data in accordance with the one or more repopulated tag entries.

In some embodiments, the tag entries and the corresponding data entries are a tag portion and a data portion of a cache used by one or more processors. In further embodiments, a plurality of processors comprise the one or more processors. In still further embodiments, at least one of the plurality of processors is not among the one or more processors. In some embodiments, the plurality of processors is part of a multi-core processor chip. According to various embodiments, the cache is one or more of: a first-level cache; a second-level cache; a third-level cache; an innermost cache; and an outermost cache.

In a fifth example embodiment, a method comprises: archiving in a memory one or more of a plurality of cache tags stored in a tag portion of a cache; then operating the cache in a low-power mode; and wherein the cache is enabled to be accessible by a processor. According to various embodiments, the method further comprises one or more of: operating, subsequent to the archiving, the processor in a sleep mode; determining that the processor is to enter the sleep mode; flushing from corresponding data entries, prior to archiving the one or more cache tags, one or more associated lines of data from the cache; determining that the processor is to exit a sleep mode; increasing power in the processor; increasing power in the cache; restoring some or all of the cache tags from the one or more archived cache tags; and reloading one or more lines of data associated with the one or more archived cache tags. In some embodiments, the archiving comprises reading tag entries of the tag portion to obtain the one or more cache tags and storing at least a portion of the one or more cache tags into the memory. In some embodiments, reducing power in the cache lowers a voltage supplied to at least a portion of the cache. In various embodiments, the one or more cache tags are read from a first one or more tag entries, and the method further comprises storing, subsequent to increasing power in the cache, into a second one or more tag entries information from one or more archived cache tags of the memory. In some embodiments, the processor is enabled to access the cache during the restoring and reloading. In further embodiments, the processor is one of a plurality of processors in a multi-core processor chip. In further embodiments, another processor among the plurality of processors is enabled to perform the archiving.

In a sixth example embodiment, a method comprises reloading one or more lines of data into a data portion of a re-fetching cache memory. According to various embodiments, the reloading is subsequent to one or more of: completion of a re-use of the data portion; and re-applying power to the data portion. In some embodiments, the method further comprises saving one or more cache tags stored in a tag portion of the re-fetching cache memory in a cache tag archive. According to various embodiments, the saving is prior to one or more of: starting the re-use of the data portion; and powering-down the data portion. In various embodiments, the method further comprises restoring an associated cache tag into the tag portion from the cache tag archive, wholly or partially overlapped in time with the reloading of the one or more lines of data. According to various embodiments, the saving comprises one or more of: copying the one or more cache tags to a save memory that is distinct from the re-fetching cache memory; placing at least the part of the tag portion that stores the one or more cache tags in a reduced-power mode; and disabling at least the part of the tag portion that stores the one or more cache tags from being modified.

In a seventh example embodiment, a method comprises repopulating at least a portion of tag entries of a re-fetching cache memory from a cache tag archive. According to various embodiments, the repopulating is subsequent to completion of one or more of: powering-up a data portion of the re-fetching cache memory; and a re-use of the data portion. According to various embodiments, the repopulating comprises one or more of: copying to the portion of tag entries from a save memory that is distinct from the re-fetching cache memory; exiting the portion of tag entries from a reduced-power mode; powering-up the portion of tag entries; and enabling the portion of tag entries to be modified. In some embodiments, the method further comprises saving, prior to starting the re-use of the data portion of the re-fetching cache memory, contents of the at least a portion of the tag entries in the cache tag archive. According to various embodiments, the saving comprises one or more of: copying the contents of the at least a portion of the tag entries to a save memory that is distinct from the re-fetching cache memory; placing the at least a portion of the tag entries in a reduced-power mode; and disabling the at least a portion of the tag entries from being modified.

CONCLUSION

Certain choices have been made in the description merely for convenience in preparing the text and drawings and unless there is an indication to the contrary the choices should not be construed per se as conveying additional information regarding structure or operation of the embodiments described. Examples of the choices include: the particular organization or assignment of the designations used for the figure numbering and the particular organization or assignment of the element identifiers (i.e., the callouts or numerical designators) used to identify and reference the features and elements of the embodiments.

The words "comprises" or "comprising" are specifically intended to be construed as being implicitly followed by the words "at least" and thus are specifically intended to be construed as abstractions describing logical sets of open-ended scope. The words "includes" or "including" are specifically intended to be construed as abstractions describing logical sets of open-ended scope and are not meant to convey physical containment unless explicitly followed by the word "within."

Although the foregoing embodiments have been described in some detail for purposes of clarity of description and understanding, the invention is not limited to the details provided. There are many embodiments of the invention. The disclosed embodiments are exemplary and not restrictive.

It will be understood that many variations in construction, arrangement, and use are possible consistent with the description and are within the scope of the claims of the issued patent. For example, interconnect and function-unit bit-widths, clock speeds, and the type of technology used are variable according to various embodiments in each component block. Names given to interconnect and logic are merely descriptive, and should not be construed as limiting the concepts described. The order and arrangement of flowchart and flow diagram process, action, and function elements are variable according to various embodiments. Also, unless specifically stated to the contrary, value ranges specified, maximum and minimum values used, or other particular specifications (such as the organization and structure of any of the cache memories; whether any of the cache memories are virtually or physically addressed, or some combination thereof; level or levels of the memory hierarchy a re-fetching cache memory is used; the precise manner in which cache tags are archived and later restored; the precise manner in which data is flushed and later reloaded; whether any or all of the cache memories are cache coherent and how cache coherency is implemented; and the number of entries or stages in registers and buffers), are merely those of the described embodiments, are expected to track improvements and changes in implementation technology, and should not be construed as limitations.

Functionally equivalent techniques known in the art are employable instead of those described to embody various components, sub-systems, functions, operations, routines, and sub-routines. It is also understood that many functional aspects of embodiments are realizable selectively in either hardware (i.e., generally dedicated circuitry) or software (i.e., via some manner of programmed controller or processor), as a function of embodiment dependent design constraints and technology trends of faster processing (facilitating migration of functions previously in hardware into software) and higher integration density (facilitating migration of functions previously in software into hardware). Specific variations in various embodiments include, but are not limited to: differences in partitioning; different form factors and configurations; use of different operating systems and other system software; use of different interface standards, network protocols, or communication links; and other variations to be expected when implementing the concepts described herein in accordance with the unique engineering and business constraints of a particular application.

The embodiments have been described with detail and environmental context well beyond that required for a minimal implementation of many aspects of the embodiments described. Those of ordinary skill in the art will recognize that some embodiments omit disclosed components or elements without altering basic cooperation among the remaining elements. It is thus understood that much of the details described are not required to implement various aspects of the embodiments described. To the extent that the remaining elements are distinguishable from the prior art, components and features that are omitted are not limiting on the embodiments described herein.

All such variations in embodiments comprise insubstantial changes over the teachings conveyed by the described embodiments. It is also understood that the embodiments described herein have broad applicability to other computing and networking applications, and are not limited to the particular application or industry of the described embodiments. The invention is thus to be construed as including all possible modifications and variations encompassed within the scope of the claims of the issued patent.

The invention claimed is:

1. A method for reducing power consumption of a cache, the cache adapted for use with a processor, the method comprising:
    requesting at least a portion of the cache to enter a low-power mode, the cache comprising a plurality of data entries and a plurality of tag entries, the tag entries in a one-to-one correspondence with the data entries, each of the data entries enabled to store a line of data, and each of the tag entries enabled to store a tag usable, at least in part, to identify any line of data stored in the corresponding data entry;
    archiving in a tag archive area, in response to the requesting, particular tags stored in at least some of the tag entries;
    reducing, in response to the requesting, power provided to at least some of the data entries;
    repopulating, after the act of reducing power, a subset of the tag entries from the tag archive area; and
    wherein the cache and the processor are implemented within one or more integrated circuits.

2. The method of claim 1, wherein the cache is a multi-way, set-associative cache, and the portion of the cache comprises data portions of one or more ways of the cache.

3. The method of claim 1, further comprising the processor accessing the cache during the archiving.

4. The method of claim 1, further comprising the processor accessing the cache during the repopulating.

5. The method of claim 4,
    wherein the cache is a multi-way, set-associative cache; and
    wherein the repopulating comprises restoring into a particular set of the cache, and the restoring into the particular set stops once all ways of the particular set are valid.

6. The method of claim 1, further comprising, prior to the repopulating, marking all of the tag entries as invalid.

7. The method of claim 1, wherein an order of the repopulating is determined based, at least in part, on a respective likely-to-be-used-soon indicator of each of the particular tags.

8. The method of claim 7, wherein the likely-to-be-used-soon indicators are determined based, at least in part, on one or more of software control, recentness of loading of the data entries, and loading of the data entries in response to misses in the cache due to accesses of the processor within a time interval after the repopulating.

9. The method of claim 1, further comprising re-fetching into at least some of the data entries having correspondence with the subset of the tag entries.

10. The method of claim 9, wherein the re-fetching is in accordance with cache coherency.

11. The method of claim 9, wherein the re-fetching is in accordance with cache coherency state archived in the tag archive area.

12. The method of claim 9,
    wherein the cache is a higher-level cache;
    wherein a lower-level cache adapted for use with the processor is coupled to the higher-level cache;
    wherein the re-fetching is a higher-level re-fetching; and
    further comprising, subsequent to the higher-level re-fetching, lower-level re-fetching into the lower-level cache.

13. The method of claim 9, further comprising the processor accessing the cache during the re-fetching.

14. The method of claim 1,
    further comprising requesting the at least a portion of the cache to exit the low-power mode; and
    wherein the repopulating is in response to the requesting the at least a portion of the cache to exit the low-power mode.

15. The method of claim 1, further comprising flushing, in response to the requesting, a dirty one of the data entries.

16. The method of claim 1, wherein the archiving comprises disabling modifications to the at least some of the tag entries.

17. The method of claim 16, further comprising operating, after the disabling, the at least some of the tag entries in a power mode where at least a portion of each of the particular tags is retained in the at least some of the tag entries and is not accessible via the cache.

18. The method of claim 1, wherein the archiving comprises copying at least a portion of each of the particular tags.

19. The method of claim 18, further comprising after the copying, operating the at least some of the tag entries in a power mode where at least a portion of each of the particular tags is not retained in the at least some of the tag entries.

20. The method of claim 1, further comprising accessing the cache as one or more of a first-level cache,
a second-level cache,
a third-level cache,
an innermost cache, and
an outermost cache.

21. A computer processing system comprising:
a cache circuit comprising a plurality of data entries and a plurality of tag entries, the tag entries in a one-to-one correspondence with the data entries, each of the data entries enabled to store a line of data, and each of the tag entries enabled to store a tag usable, at least in part, to identify any line of data in the corresponding data entry;
control logic enabled to direct archiving in a tag archive area, in response to receiving a request to enter a low-power mode, particular tags stored in at least some of the tag entries, additionally enabled, in response to the receiving the request, to direct reducing power provided to at least some of the data entries, enabled to direct repopulating a subset of the tag entries from the tag archive area, and the repopulating is subsequent to the reducing power; and
wherein the cache circuit and the control logic are implemented within one or more integrated circuits.

22. The computer processing system of claim 21, further comprising a processor coupled to the cache circuit.

23. The computer processing system of claim 22, wherein the processor is enabled to access the cache circuit during the archiving.

24. The computer processing system of claim 22, wherein the processor is enabled to access the cache circuit during the repopulating.

25. The computer processing system of claim 22, wherein the control logic is additionally enabled to direct re-fetching into at least some of the data entries having corresponding repopulated tag entries.

26. The computer processing system of claim 25, wherein the re-fetching is in accordance with cache coherency.

27. The computer processing system of claim 25, wherein the processor is enabled to access the cache circuit during the re-fetching.

28. The computer processing system of claim 22, wherein the processor is enabled to access the cache circuit as one or more of a first-level cache,
a second-level cache,
a third-level cache,
an innermost cache, and
an outermost cache.

29. The computer processing system of claim 21, wherein the repopulating is in response to receiving a request to exit the low-power mode.

30. The computer processing system of claim 21, wherein the control logic is additionally enabled to direct flushing a dirty one of the data entries in response to the receiving the request.

31. The computer processing system of claim 21, wherein the control logic is additionally enabled to direct disabling modifications to the at least some of the tag entries in response to the receiving the request.

32. The computer processing system of claim 31, wherein the control logic is additionally enabled to direct operating the at least some of the tag entries in a power mode subsequent to the disabling; and wherein at least a portion of each of the particular tags is retained in the at least some of the tag entries and is not accessible via the cache circuit while the at least some of the tag entries are operated in the power mode.

33. The computer processing system of claim 21, wherein the archiving comprises copying at least a portion of each of the particular tags.

34. The computer processing system of claim 33, wherein the control logic is additionally enabled to direct operating the at least some of the tag entries in a power mode subsequent to the copying; and wherein at least a portion of each of the particular tags is not retained in the at least some of the tag entries while the at least some of the tag entries are operated in the power mode.

35. A medium readable by a computer system that contains descriptions that specify, when interpreted by the computer system, a representation of a circuit comprising:
a cache of a processor, the cache comprising a plurality of data entries and a plurality of tag entries, the tag entries in a one-to-one correspondence with the data entries, each of the data entries enabled to store a line of data, and each of the tag entries enabled to store a tag usable, at least in part, to identify any line of data in the corresponding data entry;
control logic enabled to operate with the cache; and
wherein the control logic is additionally enabled in response to receiving a request to enter a low-power mode, to direct archiving in a tag archive area particular tags stored in at least some of the tag entries, is additionally enabled in response to the receiving the request, to direct reducing power provided to at least some of the data entries, is enabled to direct repopulating at least a subset of the tag entries from the tag archive area, and the repopulating is subsequent to the reducing power.

36. The medium of claim 35, wherein the cache is enabled to be accessed by the processor during the repopulating.

37. The medium of claim 35, wherein the control logic is additionally enabled to direct re-fetching into at least some of the data entries having correspondence with the subset of the tag entries.

38. The medium of claim 37, wherein the re-fetching is in accordance with cache coherency.

39. The medium of claim 37, wherein the cache is enabled to be accessed by the processor during the re-fetching.

40. The medium of claim 35, wherein the control logic is additionally enabled to direct disabling modifications to the at least some of the tag entries in response to the receiving the request.

41. The medium of claim 40, wherein the control logic is enabled to direct operating the at least some of the tag entries in a power mode subsequent to the disabling; and wherein at least a portion of each of the particular tags is retained in the at least some of the tag entries and is not accessible via the cache while the at least some of the tag entries are operating in the power mode.

42. The medium of claim 35, wherein the archiving comprises copying at least a portion of each of the particular tags.

43. The medium of claim 42, wherein the control logic is additionally enabled to direct operating the at least some of the tag entries in a power mode subsequent to the copying; and wherein at least a portion of each of the particular tags is not retained in the at least some of the tag entries while the at least some of the tag entries are operating in the power mode.

44. The medium of claim 35, wherein the cache is enabled to be accessed by the processor as one or more of a first-level cache,
a second-level cache,
a third-level cache,
an innermost cache, and
an outermost cache.

45. A system comprising:
means for caching, the means for caching comprising a plurality of data entries and a plurality of tag entries, the tag entries in a one-to-one correspondence with the data entries, each of the data entries enabled to store a line of data, and each of the tag entries enabled to store a tag usable, at least in part, to identify any line of data in the corresponding data entry;
means for archiving particular tags stored in at least some of the tag entries, the means for archiving responsive to receiving a request to enter a low-power mode;
means for reducing power provided to at least some of the data entries, the means for reducing power additionally responsive to the receiving the request; and
means for repopulating at least a subset of the tag entries in accordance with the means for archiving, the means for repopulating operating subsequent to the means for reducing power.

46. The system of claim 45, further comprising means for re-fetching into at least some of the data entries having correspondence with the subset of the tag entries.

47. The system of claim 46, wherein the means for re-fetching operates in accordance with cache coherency.

48. The system of claim 45, further comprising means for flushing a dirty one of the data entries, the means for flushing operating in response to the receiving the request.

49. The system of claim 45, wherein the means for reducing power is a first means for reducing power and further comprising second means for reducing power to the at least some of the tag entries, the second means for reducing power operating the at least some of the tag entries in a power mode where at least a portion of each of the particular tags is retained in the at least some of the tag entries and is not accessible via the means for caching.

* * * * *